(12) United States Patent
Doris et al.

(10) Patent No.: US 8,946,007 B2
(45) Date of Patent: Feb. 3, 2015

(54) INVERTED THIN CHANNEL MOSFET WITH SELF-ALIGNED EXPANDED SOURCE/DRAIN

(71) Applicant: International Business Machines Corporation, Armonk, NY (US)

(72) Inventors: Bruce B. Doris, Brewster, NY (US); Kangguo Cheng, Guilderland, NY (US); Ali Khakifirooz, Slingerlands, NY (US); Douglas C. La Tulipe, Jr., Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/762,044

(22) Filed: Feb. 7, 2013

(65) Prior Publication Data

US 2013/0302950 A1    Nov. 14, 2013

Related U.S. Application Data

(63) Continuation of application No. 13/468,313, filed on May 10, 2012.

(51) Int. Cl.

| H01L 21/00 | (2006.01) |
|---|---|
| H01L 29/66 | (2006.01) |
| H01L 21/74 | (2006.01) |
| H01L 29/78 | (2006.01) |
| H01L 27/12 | (2006.01) |

(52) U.S. Cl.
CPC .... *H01L 29/66477* (2013.01); *H01L 29/66636* (2013.01); *H01L 21/743* (2013.01);
(Continued)

(58) Field of Classification Search
USPC ......... 257/410, 192, 347, 369, 387, 316, 288, 257/327, 530, 365, 366, 77, 383, E23.147, 257/E27.062, E27.112, E29.255, E29.246, 257/E29.273, E29.02, E29.3, E29.264, 257/E29.242, E29.137, E29.275, E21.403, 257/E21.411, E21.639, E21.294, E21.627, 257/E21.422, E21.619, E21.621, E21.624, 257/E21.409, E21.421, E21.585, E21.561; 438/151, 157, 199, 586, 155, 455, 266, 438/585, 197, 300, 739, 283, 303, 231, 653
See application file for complete search history.

(56) References Cited

U.S. PATENT DOCUMENTS

| 5,604,368 A | 2/1997 | Taur et al. |
|---|---|---|
| 6,365,465 B1 | 4/2002 | Chan et al. |

(Continued)

OTHER PUBLICATIONS

Office Action dated Oct. 28, 2013 received in the parent U.S. Patent Application, namely U.S. Appl. No. 13/468,313.
(Continued)

*Primary Examiner* — Ori Nadav
*Assistant Examiner* — Ernest Allen, III
(74) *Attorney, Agent, or Firm* — Scully, Scott, Murphy & Presser, P.C.; H. Daniel Schnurmann

(57) ABSTRACT

After formation of a gate electrode, a source trench and a drain trench are formed down to an upper portion of a bottom semiconductor layer having a first semiconductor material of a semiconductor-on-insulator (SOI) substrate. The source trench and the drain trench are filled with at least a second semiconductor material that is different from the first semiconductor material to form source and drain regions. A planarized dielectric layer is formed and a handle substrate is attached over the source and drain regions. The bottom semiconductor layer is removed selective to the second semiconductor material, the buried insulator layer, and a shallow trench isolation structure. The removal of the bottom semiconductor layer exposes a horizontal surface of the buried insulator layer present between source and drain regions on which a conductive material layer is formed as a back gate electrode.

11 Claims, 25 Drawing Sheets

(52) U.S. Cl.
CPC ....... *H01L29/7848* (2013.01); *H01L 29/66545* (2013.01); *H01L 27/1203* (2013.01); *H01L 29/78* (2013.01); *H01L 27/12* (2013.01)
USPC ............ 438/151; 257/77; 257/192; 257/288; 257/316; 257/327; 257/347; 257/365; 257/366; 257/369; 257/383; 257/387; 257/410; 257/530; 438/155; 438/157; 438/197; 438/199; 438/231; 438/266; 438/287; 438/300; 438/303; 438/455; 438/585; 438/586; 438/653; 438/283; 438/739

(56) References Cited

U.S. PATENT DOCUMENTS

| | | | |
|---|---|---|---|
| 6,642,115 | B1 | 11/2003 | Cohen et al. |
| 6,946,696 | B2 | 9/2005 | Chan et al. |
| 6,967,377 | B2 | 11/2005 | Cohen et al. |
| 2004/0031979 | A1* | 2/2004 | Lochtefeld et al. ............ 257/233 |
| 2004/0173812 | A1* | 9/2004 | Currie et al. .................. 257/103 |
| 2005/0127412 | A1* | 6/2005 | Cohen et al. .................. 257/288 |
| 2005/0142703 | A1* | 6/2005 | Zahurak et al. ................ 438/157 |
| 2006/0011984 | A1* | 1/2006 | Currie ........................... 257/352 |
| 2006/0027881 | A1 | 2/2006 | Ilicali et al. |
| 2008/0164528 | A1 | 7/2008 | Cohen et al. |
| 2008/0206977 | A1 | 8/2008 | Frank et al. |
| 2009/0011562 | A1 | 1/2009 | Licitra et al. |

OTHER PUBLICATIONS

U.S. Office Action dated May 30, 2014, issued in related U.S. Appl. No. 13/468,313.

Office Action dated Oct. 2, 2014 received in U.S. Appl. No. 13/468,313.

* cited by examiner

INVERTED THIN CHANNEL MOSFET WITH SELF-ALIGNED EXPANDED SOURCE/DRAIN

CROSS REFERENCE TO RELATED APPLICATION

This application is a continuation of U.S. patent application Ser. No. 13/468,313, filed May 10, 2012 the entire content and disclosure of which is incorporated herein by reference.

BACKGROUND

The present disclosure relates to semiconductor devices, and particularly to semiconductor structures including expanded source and drain that extend in an opposite direction of a gate electrode and methods of fabricating the same.

As semiconductor devices are scaled down to smaller dimensions, the deleterious effects of parasitic capacitances on the performance of the semiconductor devices become greater. In particular, the parasitic capacitance between a gate electrode and various contact vias to the source region and the drain region of a field effect transistor becomes a significant portion of the total capacitance of the field effect transistor. Thus, devices are desired that minimize the parasitic capacitance due to proximity of the contact vias to the gate electrode of a field effect transistor.

BRIEF SUMMARY

After formation of a gate electrode, a source trench and a drain trench are formed through a top semiconductor layer, a buried insulator layer, and an upper portion of a bottom semiconductor layer having a first semiconductor material of a semiconductor-on-insulator (SOI) substrate. The source trench and the drain trench are filled with at least a second semiconductor material that is different from the first semiconductor material to form a source region and a drain region. A planarized dielectric layer is formed and a handle substrate is attached over the source region and the drain region. The bottom semiconductor layer is thinned, and remaining portions of the bottom semiconductor layer are removed selective to the second semiconductor material, the buried insulator layer, and a shallow trench isolation structure. A contact level dielectric layer is deposited on surfaces of the source region and the drain region that are distal from the gate electrode, and contact vias are formed through the contact level dielectric layer.

According to an aspect of the present disclosure, a semiconductor structure including a field effect transistor is provided. The semiconductor structure includes a stack of a body-containing region and a buried insulator portion. The body-containing region includes a channel of the field effect transistor. A gate dielectric is in contact with a surface of the body-containing region. A gate electrode is in contact with the gate dielectric. A source region and a drain region are laterally spaced by, and are in contact with, the stack. Each of the source region and the drain region includes a sidewall that contiguously extends above a topmost surface of the stack and below a bottommost surface of the stack.

According to another aspect of the present disclosure, a method of manufacturing a semiconductor structure is provided. A semiconductor-on-insulator (SOI) substrate including a stack of a bottom semiconductor layer having a first semiconductor material, a buried insulator layer, and a top semiconductor layer is provided. A gate dielectric, a gate electrode, and a gate spacer on the top semiconductor layer are formed. A source trench and drain trench are formed through the top semiconductor layer, the buried insulator layer, and a portion of the bottom semiconductor layer. A source region and a drain region are formed by depositing at least a second semiconductor material that is different from the first semiconductor material. The bottom semiconductor layer is removed selective to the second semiconductor material and the buried insulator layer.

DETAILED DESCRIPTION

The present disclosure which relates to semiconductor structures including expanded source and drain that extend in an opposite direction of a gate electrode and methods of fabricating the same, will not be described in detail with accompanying figures.

Figure 1:
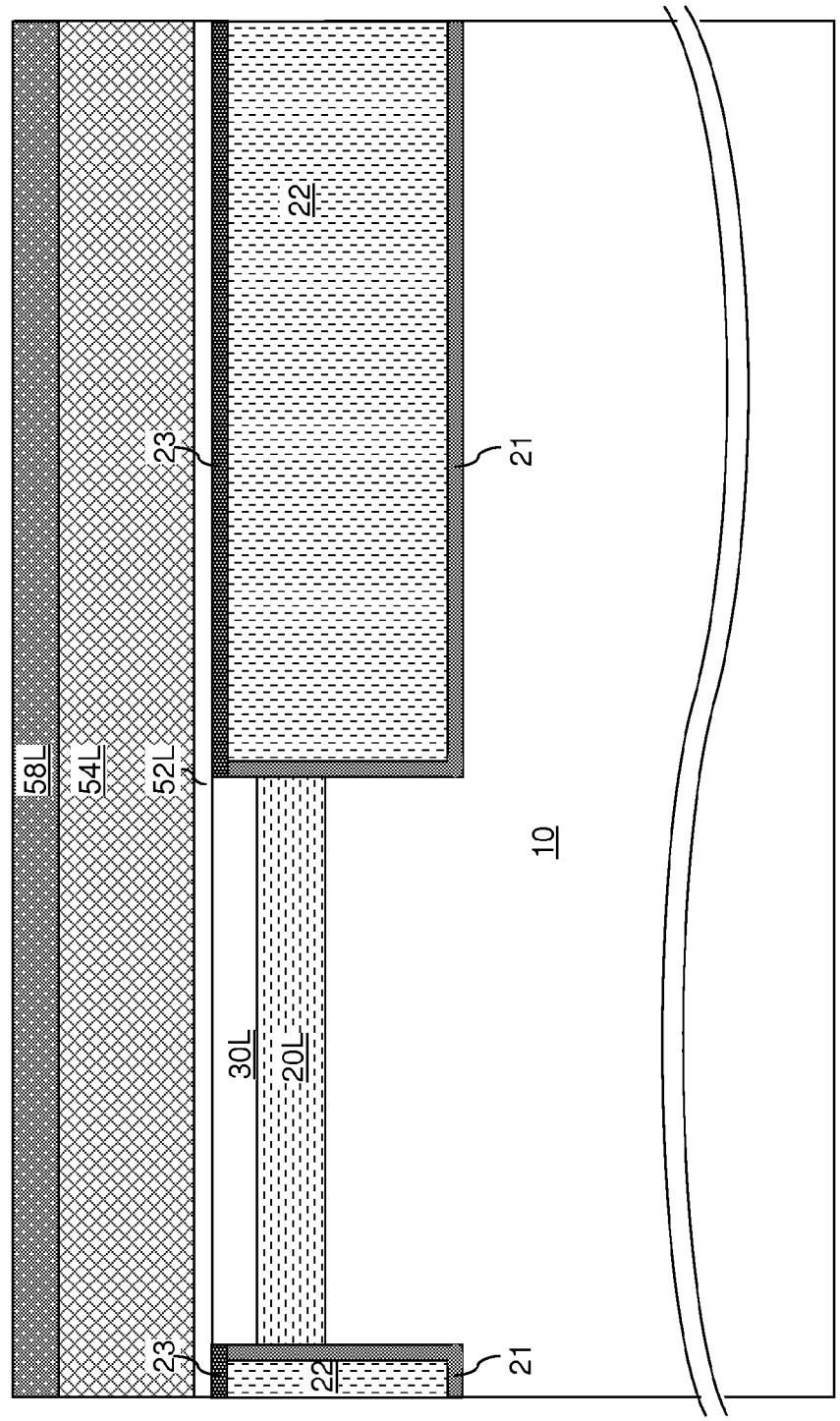
FIG. 1 is a vertical cross-sectional view of a first exemplary semiconductor structure after formation of a shallow trench isolation structure and various gate stack layers according to an embodiment of the present disclosure.

Referring to FIG. 1, a semiconductor-on-insulator (SOI) substrate is provided. The SOI substrate includes a bottom semiconductor layer 10, a buried insulator layer 20L, and a top semiconductor layer 30L. Since the SOI substrate is later flipped upside down, the top semiconductor layer 30L is physically located beneath the buried insulator layer 20L in the final structure. For this reason, references to "top" and "bottom" are to be interpreted depending on the context and accompanying drawings.

The bottom semiconductor layer 10 includes a first semiconductor material, for which there exists an etch chemistry that removes the first semiconductor material selective to a second semiconductor material, i.e., an etch chemistry that removes the first semiconductor material while not removing the second semiconductor material. In one embodiment, the etch selectivity of the etch chemistry can be greater than 10. As used herein, the etch selectivity is the ratio of the thickness of the removed material of the first semiconductor material to the thickness of the removed material of the second semiconductor material.

In one embodiment, the etch chemistry that removes the first semiconductor material selective to the second semiconductor material is also selective to the dielectric material of the buried insulator layer 20L.

In one example, the first semiconductor material can be silicon, the second semiconductor material can be a silicon germanium alloy, and the etch chemistry can be a wet etch chemistry that employs KOH or tetramethylammonium hydroxide (TMAH). In another example, the first semiconductor material can be a silicon germanium alloy, the second semiconductor material can be silicon, and the etch chemistry can be a wet etch chemistry that employs hydrogen peroxide.

The bottom semiconductor layer 10 can include a single crystalline semiconductor material such as single crystalline silicon, a single crystalline silicon germanium alloy, or a single crystalline silicon carbon alloy. The thickness of the bottom semiconductor layer 10 is sufficient to mechanically support handling of the SOI substrate. For example, the thickness of the bottom semiconductor layer 10 can be from 100 microns to 2 mm, although lesser and greater thicknesses can also be employed.

The buried insulator layer 20L includes a dielectric material such as silicon oxide, silicon nitride, a dielectric metal oxide, or a combination thereof. The thickness of the buried insulator layer 20L can be from 5 nm to 200 nm, although lesser and greater thicknesses can also be employed. In one embodiment, the thickness of the buried insulator layer 20L can be from 10 nm to 30 nm.

As provided in the SOI substrate, the top semiconductor layer 30L is an unpatterned layer having the same thickness throughout. The thickness of the top semiconductor layer 30L can be, for example, from 5 nm to 500 nm, although lesser and greater thicknesses can also be employed. The top semiconductor layer 30L includes a single crystalline semiconductor material such as single crystalline silicon, a single crystalline silicon germanium alloy, a single crystalline silicon carbon alloy, silicon carbide, or a single crystalline compound semiconductor material known in the art. The top semiconductor layer 30L may, or may not, be doped with p-type dopants or n-type dopants.

Shallow trenches extending from the top surface of the top semiconductor layer 30L to an upper portion of the bottom semiconductor layer 30L can be formed, for example, by applying an optional disposable pad layer (not shown) and a photoresist layer (not shown) on the top surface of the top semiconductor layer 30L, lithographically patterning the photoresist layer, and transferring the pattern in the patterned photoresist layer through the top semiconductor layer 30L, the buried insulator layer 20L, and the upper portion of the bottom semiconductor layer 30L by a pattern transfer etch, which can be an anisotropic etch. The photoresist layer is subsequently removed, for example, by ashing. The optional disposable pad layer may be retained at this point.

Optionally, a shallow trench liner 21 can be formed, for example, by conformal deposition of a dielectric material. In one embodiment, the shallow trench liner 21 includes a material having substantial etch selectivity (i.e., greater than 10) to the first semiconductor material of the bottom semiconductor layer 10 in an etch to be subsequently employed to remove the first semiconductor material. For example, the shallow trench liner 21 can include silicon nitride and/or dielectric metal oxide such as $HfO_2$, $ZrO_2$, $LaO_2$, or nitridated compounds or combinations thereof. The thickness of the shallow trench liner 21, if employed, can be from 1 nm to 10 nm, although lesser and greater thicknesses can also be employed. The shallow trench liner 21 can be deposited as a continuous and conformal layer in the shallow trenches and over the top surface of the top semiconductor layer 30L (and over the optional disposable pad layer, if present).

A shallow trench isolation structure 22 can be formed by depositing a dielectric material over the shallow trench line 21, planarizing the dielectric material so that the deposited dielectric material is removed from above the top semiconductor layer 30L, and by recessing the remaining portions of the dielectric material layer so that that top surface of the shallow trench isolation structure 22 is recessed below the top surface of the top semiconductor layer 30L. The optional disposable pad layer or the top semiconductor layer 30L can be employed as an etch mask during a recess etch that recesses the remaining portions of the dielectric material layer. The dielectric material of the shallow trench isolation structure 22 can be, for example, silicon oxide.

Optionally, a shallow trench cap layer 23 can be formed, for example, by deposition of a dielectric material. In one embodiment, the shallow trench cap layer 23 includes a material having substantial etch selectivity (i.e., greater than 10) to the dielectric material of the buried insulator layer 20L during an etch to be subsequently employed to remove portions of the buried insulator layer 20L. For example, the shallow trench cap layer 23 can include silicon nitride and/or a dielectric metal oxide such as $HfO_2$, $ZrO_2$, $LaO_2$, or nitridated compounds or combinations thereof. The thickness of the shallow trench cap layer 23 can be from 1 nm to 10 nm, although lesser and greater thicknesses can also be employed. The shallow trench cap layer 23 can be deposited as a continuous and conformal layer over the shallow trench isolation structure 22 and over the top surface of the top semiconductor layer 30L (and over the optional disposable pad layer, if present). The portion of the shallow trench cap layer 23 above the top semiconductor layer 30L can be removed, for example, by chemical mechanical planarization. If any remaining portion of the disposable pad layer can be subsequently removed.

Gate level layers can be subsequently deposited. The gate level layers can include, for example, a gate dielectric layer 52L, a gate conductor layer 54L, and a gate cap dielectric layer 58L. The gate dielectric layer 52L can include any dielectric material that can be employed for a gate dielectric of a field effect transistor as known in the art. The gate conductor layer 54L can include any conductive material that can be employed for a gate electrode of a field effect transistor as known in the art. The gate cap dielectric layer 58L includes a dielectric material that provides etch selectivity to the dielectric material of the buried insulator layer 20L and the semiconductor material of the top semiconductor layer 30L and the bottom semiconductor layer 10 in an etch to be subsequently employed. For example, if the buried insulator layer 20L includes silicon oxide, the gate cap dielectric layer 58L can include silicon nitride or a dielectric metal oxide.

Figure 2:
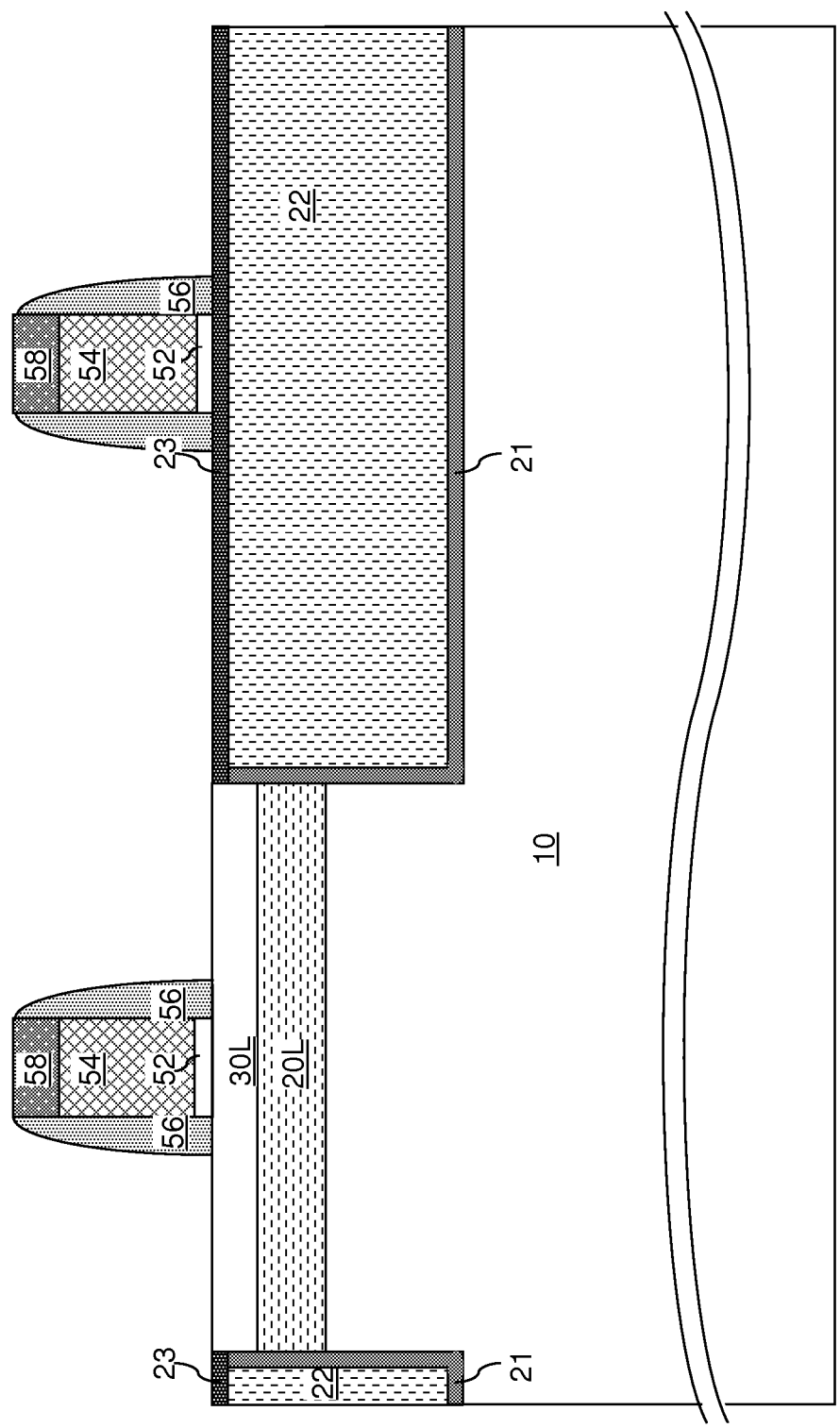
FIG. 2 is a vertical cross-sectional view of the first exemplary semiconductor structure after formation of gate stacks and gate spacers according to an embodiment of the present disclosure.
Figure 2A:
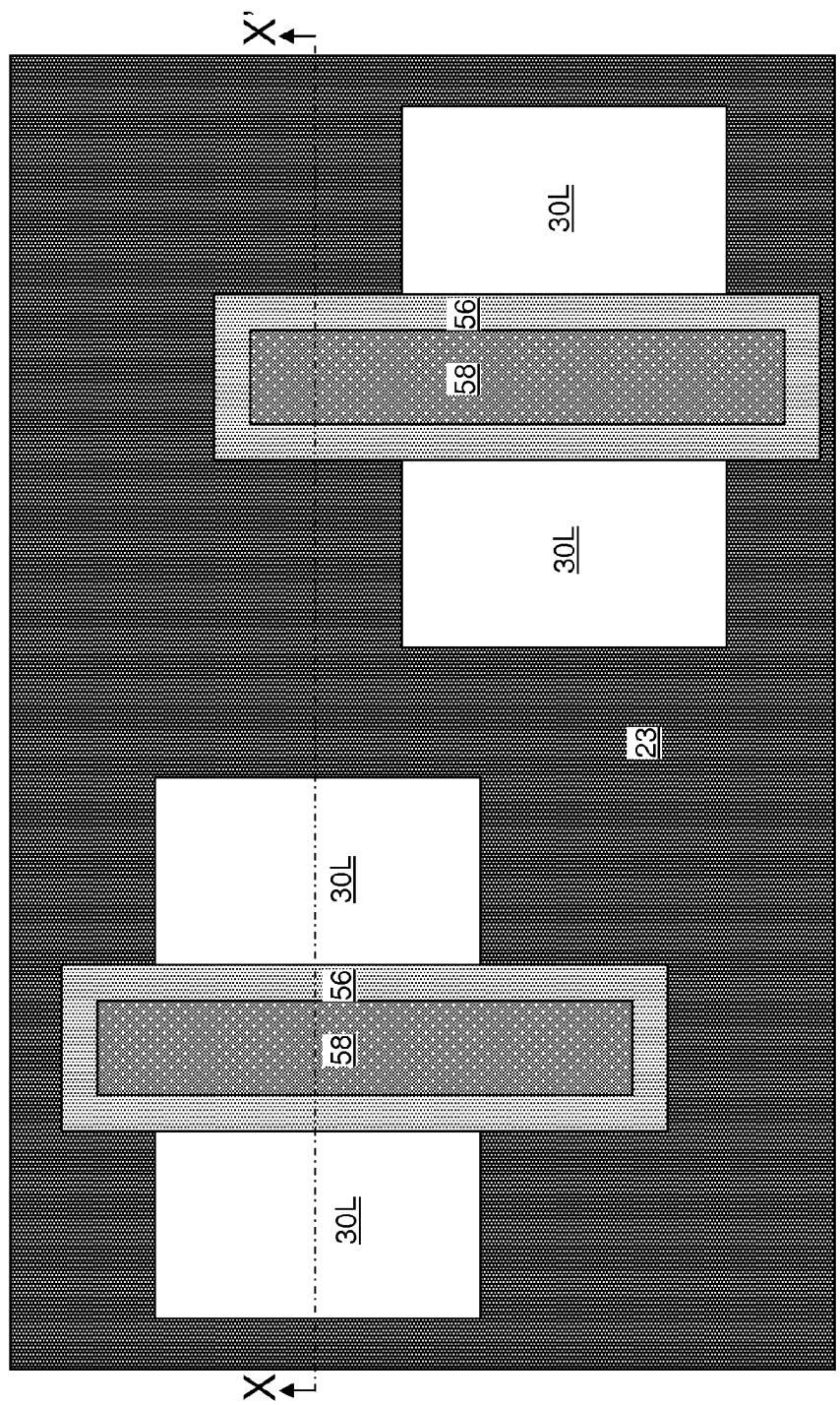
FIG. 2A is a top-down view of the first exemplary semiconductor structure of FIG. 2. The plane X-X' is the plane of the vertical cross-section of FIG. 2.

Referring to FIGS. 2 and 2A, the gate level layers (52L, 54L, 58L) can be patterned to form various gate stacks, each of which includes a gate dielectric 52, a gate conductor 54, and a gate cap dielectric 56. Source extension regions (not shown) and drain extension regions (not shown) can be formed by implanting electrical dopants (p-type dopants or n-type dopants) into portions of the top semiconductor layer 30L not masked by the gate stacks (52, 54, 58). Subsequently, gate spacers 56 including a dielectric material can be formed on sidewalls of the gate stacks (52, 54, 58). Each gate spacer 56 laterally surrounds a gate electrode 54, and has a horizontal cross-sectional area that monotonically decreases with increasing height. In one embodiment, the gate spacers 56 include a dielectric material that provides etch selectivity to the dielectric material of the buried insulator layer 20L and the semiconductor material of the top semiconductor layer 30L and the bottom semiconductor layer 10 in an etch to be subsequently employed. For example, if the buried insulator layer 20L includes silicon oxide, the gate spacers 56 can include silicon nitride or a dielectric metal oxide.

As used herein, a function "monotonically decreases with" a parameter if, for any second value for the parameter greater than a first value for the parameter, the value of the function corresponding to the second value is not greater than the value of the function corresponding to the first value. As used herein, a function "monotonically increases with" a parameter if, for any second value for the parameter greater than a first value for the parameter, the value of the function corresponding to the second value is not less than the value of the function corresponding to the first value.

Figure 3:
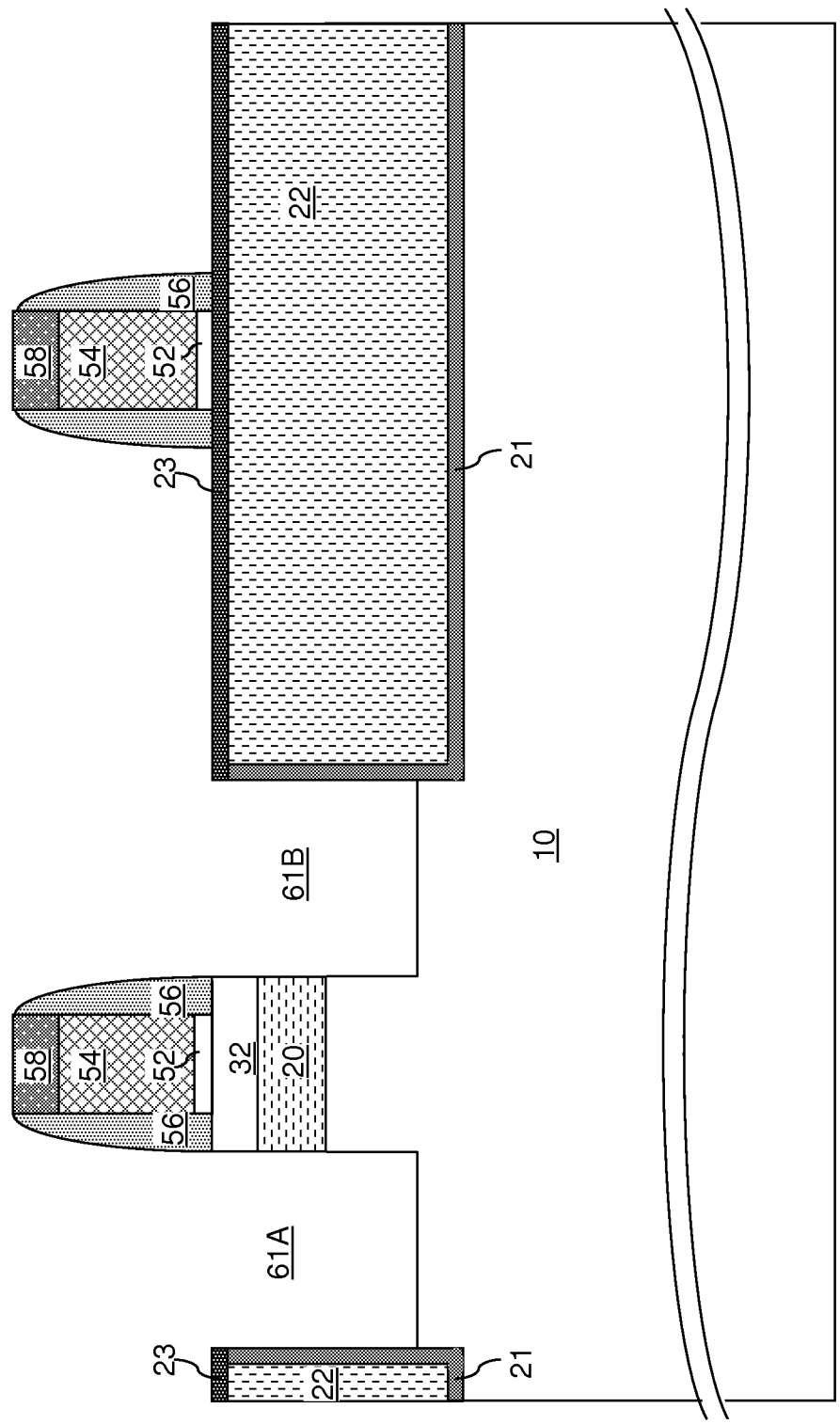
FIG. 3 is a vertical cross-sectional view of the first exemplary semiconductor structure after formation of a source trench and a drain trench according to an embodiment of the present disclosure.

Referring to FIG. 3, a source trench 61A and a drain trench 61B are formed in areas including physically exposed surfaces of the top semiconductor layer 30L. A pair of a source trench 61A and a drain trench 61B can be formed on both sides of a gate stack (52, 54, 58) and the gate spacer 56 that laterally surrounds that gate stack (52, 54, 58). The lateral extent of each source trench 61A and each drain trench 61B can be bounded by the shallow trench isolation structure 22 or the shallow trench liner 21.

In one embodiment, the sidewalls of each pair of a source trench 61A and drain trench 61B around a gate stack (52, 54, 58) can be vertically coincident with the bottom portion of outer sidewalls of the gate spacer 56 that laterally surrounds the gate stack (52, 54, 58). As used herein, a first sidewall is "vertically coincident" with a second sidewall if the first sidewall and the second sidewall coincide in a top down view along the direction of the first or second sidewall. The depth of the source trench 61A and the drain trench 61B can be selected so that the bottom surfaces of the source trench 61A and the drain trench 61B is recessed below the bottom surface of the buried insulator layer 20L. The sidewalls of the source trench 61A and the drain trench 61B can be substantially vertical.

Each remaining portion of the top semiconductor layer 30L between a pair of a source trench 61A and a drain trench 61B is herein referred to as a body-containing region 32. The body-containing region 32 includes a channel region of a field effect transistor to be subsequently formed. If source extension regions and drain extension regions are formed prior to formation of the gate spacers 56, peripheral regions of each body-containing region 32 can include a source extension region (not shown) and a drain extension region (not shown).

Each remaining portion of the buried insulator layer 20L between a pair of source trench 61A and a drain trench 61B is herein referred to as a buried insulator portion 20. A stack of a body-containing region 32 and a buried insulator portion 20 is formed between each pair of a source trench 61A and a drain trench 61B.

Figure 4:
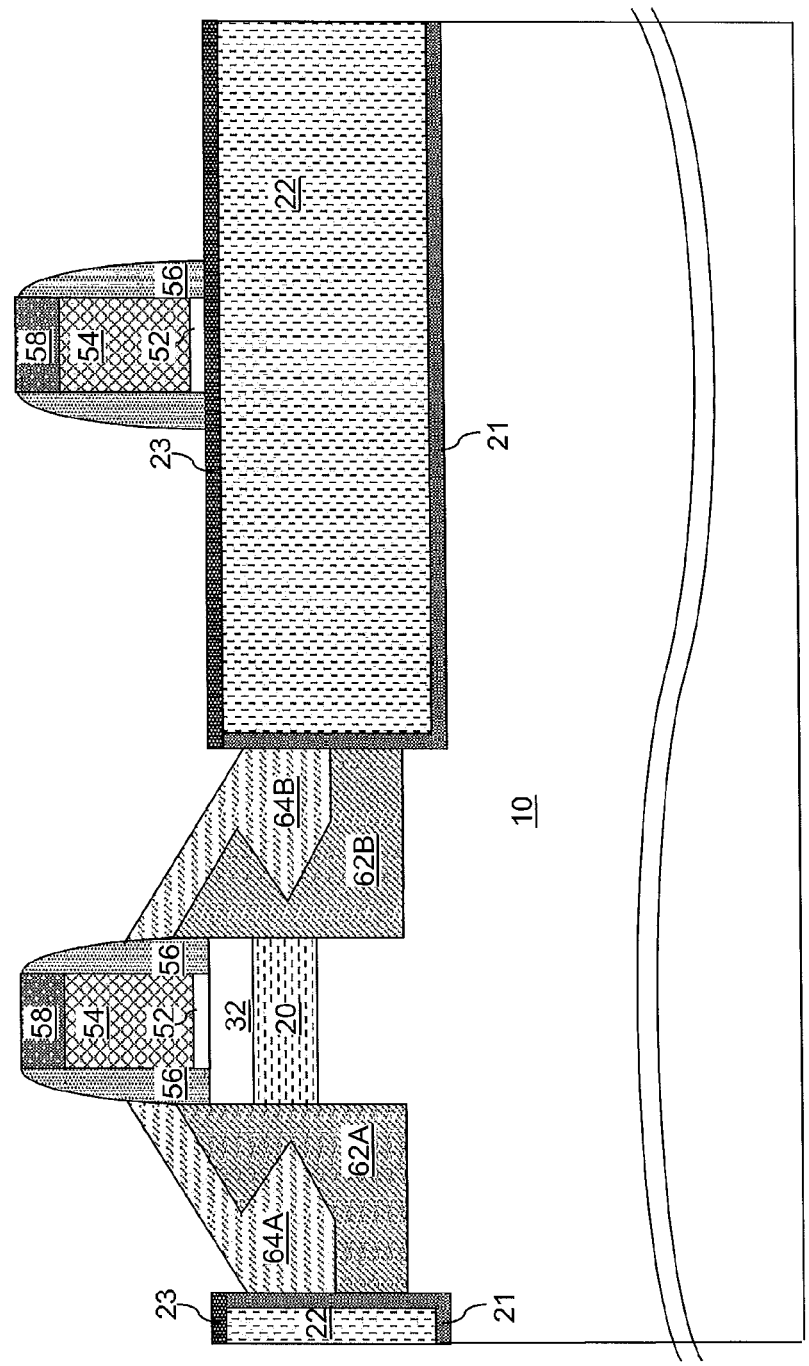
FIG. 4 is a vertical cross-sectional view of the first exemplary semiconductor structure after formation of a source region and a drain region by selective deposition of a second semiconductor material according to an embodiment of the present disclosure.

Referring to FIG. 4, a source region and a drain region can be formed by selective deposition of at least a second semiconductor material, which is different from the first semiconductor material of the bottom semiconductor layer 10. For example, if the first semiconductor material is silicon, the second semiconductor material can be a silicon germanium alloy or a silicon carbon alloy. If the first semiconductor material is a silicon germanium alloy, the second semiconductor material can be silicon or a silicon carbon alloy.

The second semiconductor material can be deposited, for example, by selective epitaxy. In this case, the second semiconductor material can be deposited on physically exposed semiconductor surfaces, and does not grow from dielectric surfaces such as the surfaces of the gate cap dielectrics 58, the gate spacers 56, the shallow trench cap layer 23, or the shallow trench liner 21. The selective epitaxy of the second semiconductor material can be effected by placing the first exemplary semiconductor structure of FIG. 4 into a reaction chamber, and simultaneously, or alternately, flowing at least one reactant gas (such as $SiH_4$, $Si_2H_6$, $SiH_2Cl_2$, $GeH_4$, $C_2H_2$, $C_2H_4$) and an etchant gas (such as HCl) into the reaction chamber. Optionally, a carrier gas such as $H_2$, $N_2$, and/or Ar can be flowed into the reaction chamber.

The second semiconductor material can grow from the semiconductor surfaces of the bottom semiconductor layer 10 and the semiconductor surfaces of the body-containing region 32. Two portions of the second semiconductor material that grow from the bottom surface of the source trench 61A and a sidewall of the body-containing region 32 merge to form a contiguous structure, which is herein referred to as a proximal source region 62A. The proximal source region 62A contacts the entirety of the bottom surface of the source trench 61A and sidewalls of the bottom semiconductor layer 10, the buried insulator portion 20, and the body-containing region 32 that are physically exposed within the source trench 61A prior to the selective epitaxy. Likewise, two portions of the second semiconductor material that grow from the bottom surface of the drain trench 61B and another sidewall of the body-containing region 32 merge to form a contiguous structure, which is herein referred to as a proximal drain region 62B. The proximal drain region 62B contacts the entirety of the bottom surface of the drain trench 61B and sidewalls of the bottom semiconductor layer 10, the buried insulator portion 20, and the body-containing region 32 that are physically exposed within the drain trench 61B prior to the selective epitaxy. Thus, the selective epitaxy of the second semiconductor material forms a proximal source portion 62A in each source trench 61A and a proximal drain portion 62B in each drain trench 61B.

The second semiconductor material of the proximal source region 62A and the proximal drain region 62B can be deposited as an intrinsic semiconductor material, or can be deposited with in-situ doping or electrical dopants (p-type dopants or n-type dopants). If the second semiconductor material of the proximal source region 62A and the proximal drain region 62B are deposited as an intrinsic semiconductor material, the proximal source region 62A and the proximal drain region 62B are subsequently doped with electrical dopants, for example, by ion implantation.

At least one additional semiconductor material that is different from the second semiconductor material can be subsequently deposited directly on the proximal source portion 62A and the proximal drain portion 62B. The at least one additional semiconductor material can be deposited on the surfaces of the proximal source portion 62A and proximal drain portion 62B selective to the dielectric surfaces of the gate cap dielectrics 58, the gate spacers 56, the shallow trench cap layer 23, or the shallow trench liner 21. The additional semiconductor material can be the same as the first semiconductor material, or can be different from the first semiconductor material. The additional semiconductor material can be a semiconductor material that can be grown epitaxially on the second semiconductor material, or can be a material that does not allow epitaxial alignment with the second semiconductor material, for example, due to significant lattice mismatch.

Selective deposition of the at least one additional semiconductor material forms a distal source portion 64A, which is formed directly on the surfaces of the proximal source portion 64A, and a distal drain portion 64B, which is formed directly on the surfaces of the proximal drain portion 64B. In one embodiment, the distal source portion 64A and the distal drain portion 64B can be single crystalline, and epitaxially aligned to the proximal source portion 62A or the proximal drain portion 62B, respectively. For example, the distal source portion 64A and the distal drain portion 64B can include single crystalline silicon or a single crystalline silicon germanium alloy or a single crystalline silicon carbon alloy. In another embodiment, the distal source portion 64A and the distal drain portion 64B can be polycrystalline. For example, the distal source portion 64A and the distal drain portion 64B can include polysilicon or a polycrystalline silicon germanium alloy or a polycrystalline silicon carbon alloy.

The at least one additional semiconductor material of the distal source region 64A and the distal drain region 64B can be deposited as an intrinsic semiconductor material, or can be deposited with in-situ doping or electrical dopants (p-type dopants or n-type dopants). If the at least one additional semiconductor material of the proximal source region 62A and the proximal drain region 62B are deposited as an intrinsic semiconductor material, the proximal source region 62A and the proximal drain region 62B are subsequently doped with electrical dopants, for example, by ion implantation.

The proximal source portion 62A and the distal source portion 64A collectively constitute a source region of a field effect transistor, and the proximal drain portion 62B and the distal drain portion 64B collectively constitute a drain region of the field effect transistor. The source region (62A, 64A) and the drain region (62B, 64B) have a doping of the same conductivity type (i.e., p-type or n-type).

The source region (62A, 64A) and the drain region (62B, 64B) of each field effect transistor are laterally spaced by, and in contact with, a stack of a buried insulator portion 20 and a body-containing region 32. As discussed above, the body-containing region 32 includes a channel region, which is the channel of the field effect transistor. The distal source portion 64A is located at a greater distance from the stack of the buried insulator portion 20 and the body- containing region 32 than the proximal source portion 62A, which contacts the stack (20, 32) (and therefore, has a distance of zero to the stack). The distal drain portion 64B is located at a greater distance from the stack (20, 32) than the proximal drain portion 62B, which contacts the stack (20, 32) (and therefore, has a distance of zero to the stack).

Each of the source region (62A, 64A) and the drain region (62B, 64B) includes a sidewall that contiguously extends above the topmost surface of the stack (20, 32) (i.e., the top surface of the body-containing region 32 in an upright view or the interface between the buried insulator portion 20 and the bottom semiconductor layer 10 in an upside-down view) and below a bottommost surface of the stack (20, 32) (i.e., the interface between the buried insulator portion 20 and the bottom semiconductor layer 10 in an upright view or the interface between the body-containing region 32 and the gate dielectric 52 in an upside-down view).

Figure 5:
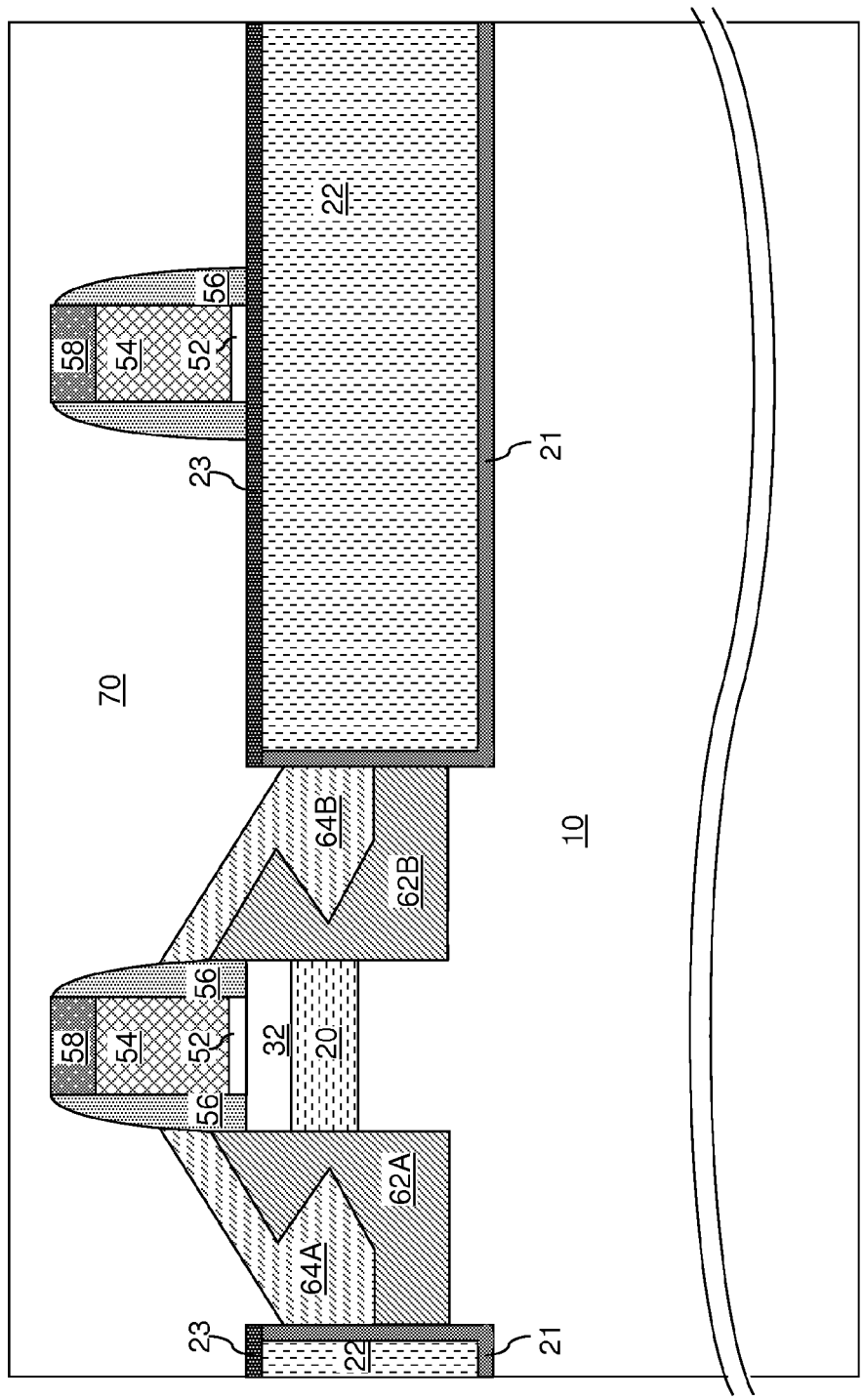
FIG. 5 is a vertical cross-sectional view of the first exemplary semiconductor structure after formation of a planarized dielectric layer according to an embodiment of the present disclosure.

Referring to FIG. 5, a planarization dielectric layer 70 can be deposited over the gate stacks (52, 54, 58), the gate spacers 56, the source region (62A, 64A), the drain region (62B, 64B), and the shallow trench isolation structure 22, for example, by chemical vapor deposition or spin coating. For example, the planarization dielectric layer 70 can include doped or undoped silicon oxide, silicon nitride, or a combination thereof.

The planarization dielectric layer 70 can be formed as a self-planarizing layer, e.g., a spin-coated layer, or can be formed as a non-self-planarizing layer that is subsequently planarized, for example, by chemical mechanical planarization (CMP). A planar top surface of the planarization dielectric layer 70 is thus provided above, or at the top surface of, the gate cap dielectrics 58. In one embodiment, the planar topmost surface of the planarization dielectric layer 70 includes silicon oxide.

Figure 6:
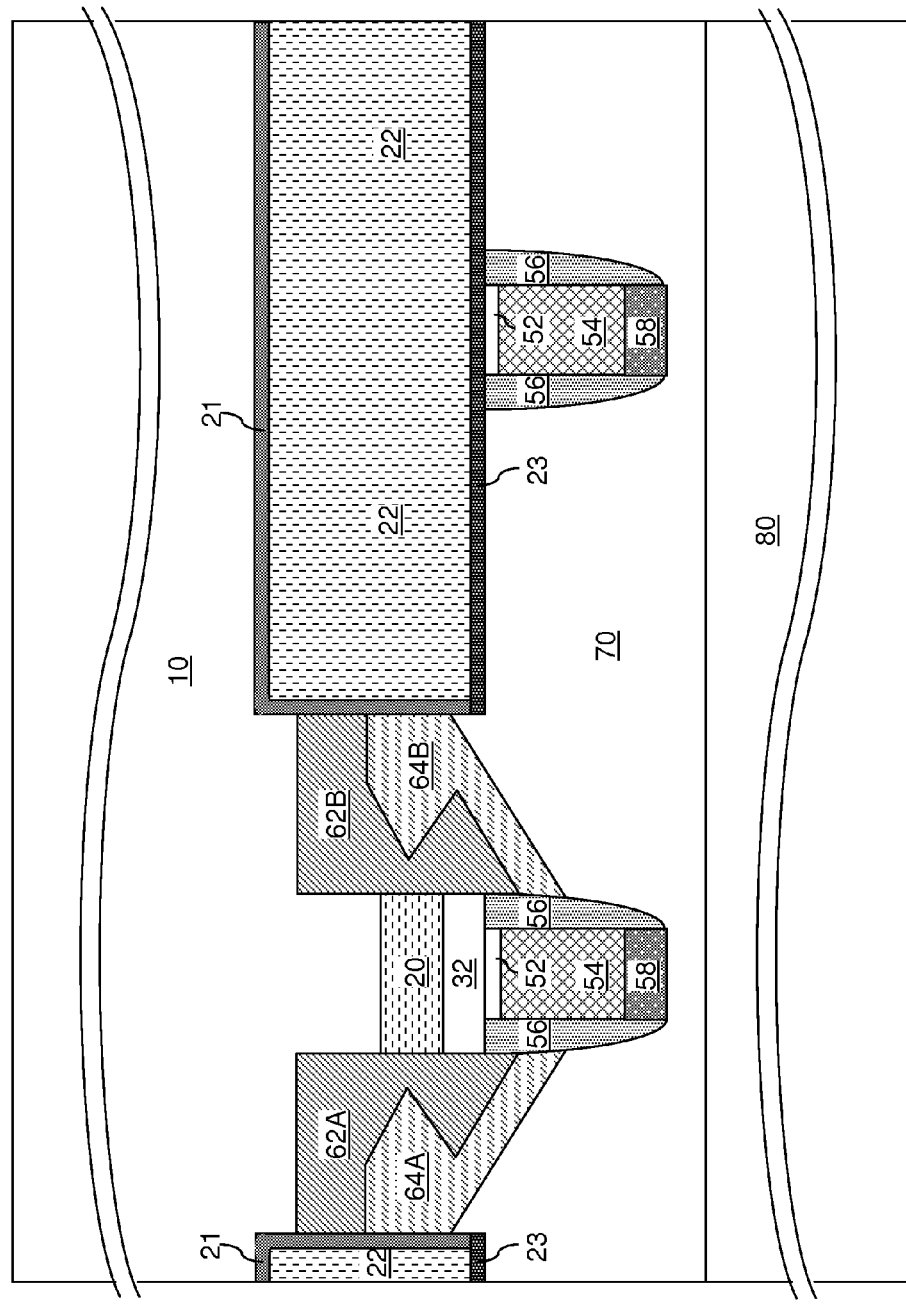
FIG. 6 is a vertical cross-sectional view of the first exemplary semiconductor structure after bonding a handle substrate to the planarized dielectric layer and flipping the first exemplary semiconductor structure upside down according to an embodiment of the present disclosure.

Referring to FIG. 6, a handle substrate 80 can be bonded to the planar top surface of planarization dielectric layer 70. The handle substrate 80 can include any material provided that the handle substrate 80 is capable of providing mechanical support to the first semiconductor structure during subsequent mechanical handling, and that the handle substrate 80 is capable of withstanding subsequent processing steps, e.g., anneal steps at elevated temperatures at or about 400 degrees Celsius. The handle substrate 80 can include dielectric material, a semiconductor material, a conductive material, or a combination thereof. The thickness of the handle substrate 80 can be from 50 microns to 2 mm, although lesser and greater thicknesses can also be employed. The first exemplary structure can be flipped upside down before, or after, bonding the planarization dielectric layer 70 with the handle substrate 80.

Figure 7:
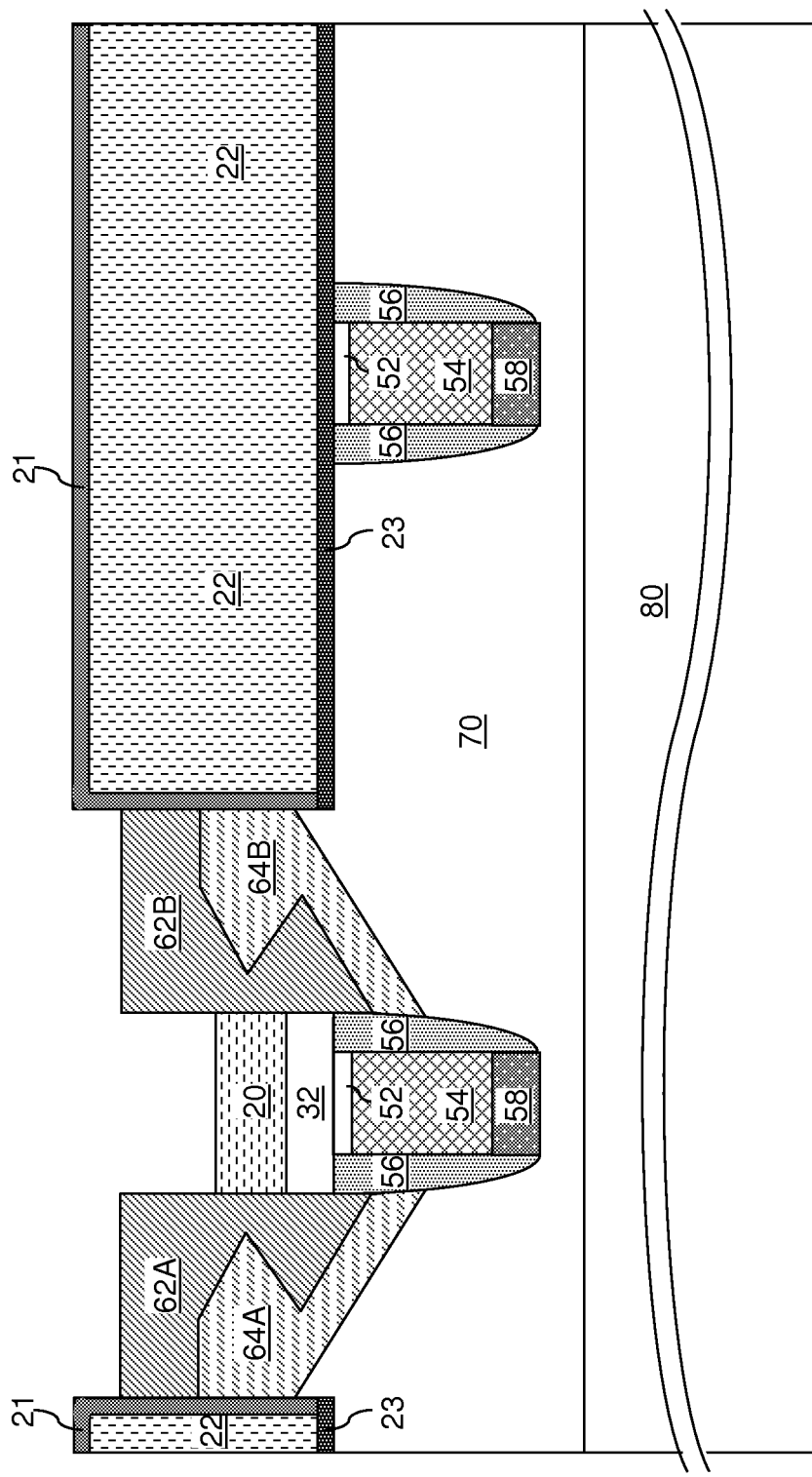
FIG. 7 is a vertical cross-sectional view of the first exemplary semiconductor structure after removal of a first semiconductor material of a bottom semiconductor layer selective to the second semiconductor material, the buried insulator layer, and the material of the shallow trench isolation structure according to an embodiment of the present disclosure.

Referring to FIG. 7, a portion of the bottom semiconductor layer 10 that is vertically spaced from the source region (62A, 64A) and the drain region (62B, 64b) can be removed. For example, the portion of the bottom semiconductor layer 10 that is vertically spaced from the source region (62A, 64A) and the drain region (62B, 64b) can be removed by grinding of the bottom semiconductor layer 10 from an upper surface (in the upside-down position illustrated in FIG. 6) or by cleaving of the bottom semiconductor layer 10. The cleaving of the bottom semiconductor layer 10 can be effected, for example, by implanting hydrogen atoms along a horizontal plane within the bottom semiconductor layer 10 and subsequently performing an anneal as known in the art.

The remaining portion of the bottom semiconductor layer 10 after removal of the upper portion of the bottom semiconductor layer (in the upside-down position illustrated in FIG. 6) can be removed selectively to the second semiconductor material and the buried insulator portion 20. For example, the first semiconductor material of the bottom semiconductor layer 10 can be removed by an etch that removes first semiconductor material while not removing the second semiconductor material or the dielectric material of the buried insulator portion 20.

In one example, the first semiconductor material can be silicon, the second semiconductor material can be a silicon germanium alloy, and the etch chemistry can be a wet etch chemistry that employs KOH or tetramethylammonium hydroxide (TMAH). In another example, the first semiconductor material can be a silicon germanium alloy, the second semiconductor material can be silicon, and the etch chemistry can be a wet etch chemistry that employs hydrogen peroxide.

Figure 8:
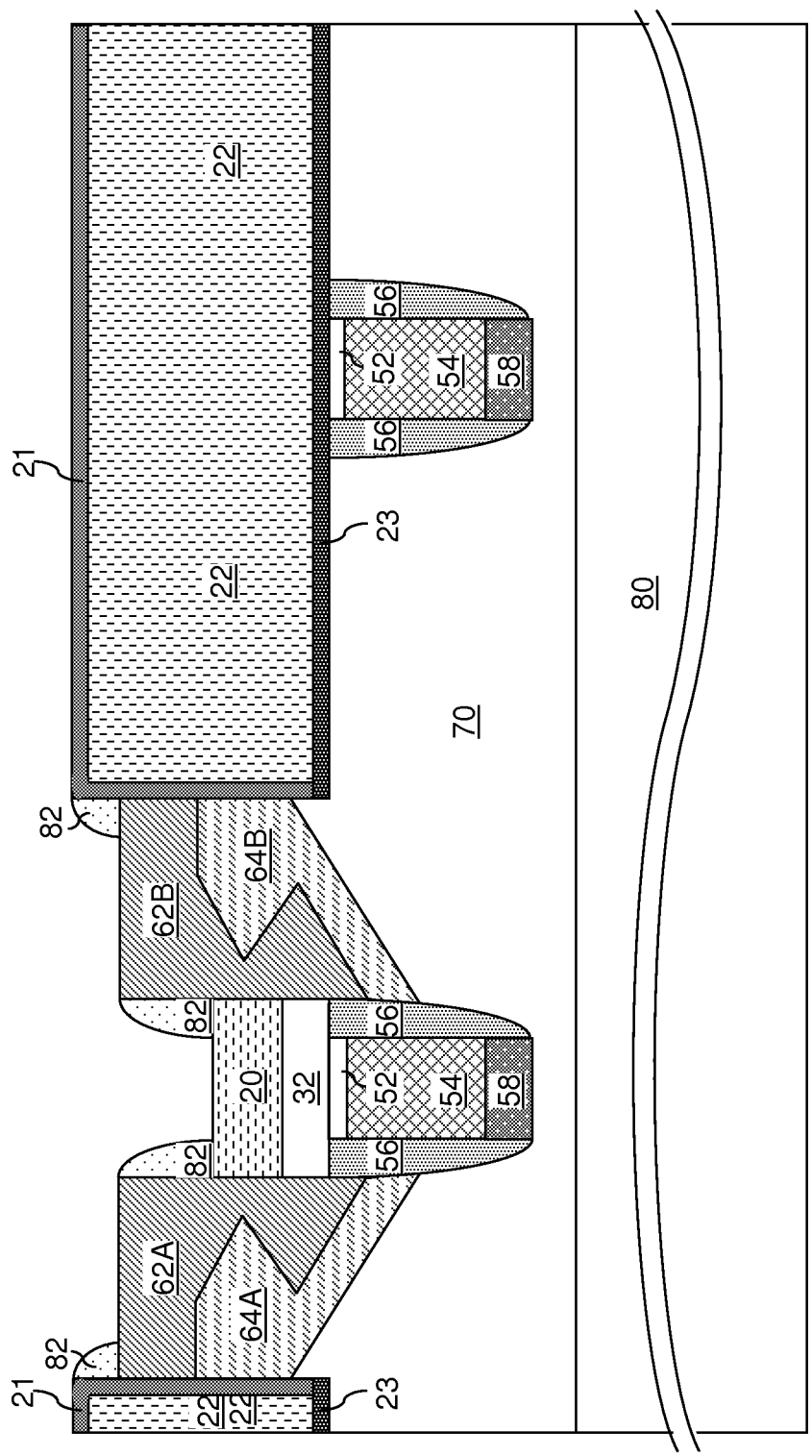
FIG. 8 is a vertical cross-sectional view of the first exemplary semiconductor structure after formation of a dielectric spacer according to an embodiment of the present disclosure.
Figure 8A:
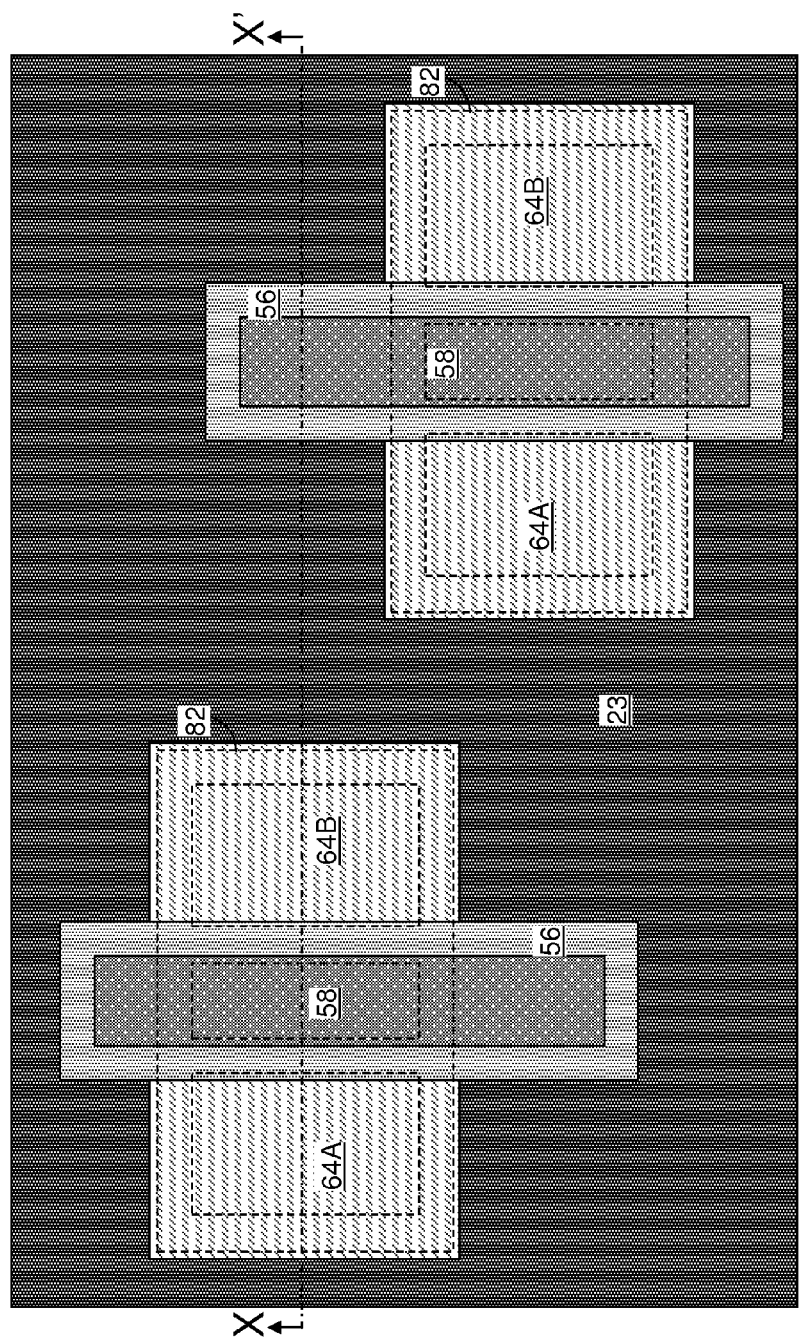
FIG. 8A is a bottom-up view of the first exemplary semiconductor structure of FIG. 8 in which the handle substrate and the planarized dielectric layer are removed for clarity, and the area of the dielectric spacer is schematically marked according to an embodiment of the present disclosure. The plane X-X' is the plane of the vertical cross-section of FIG. 8.

Referring to FIGS. 8 and 8A, a dielectric spacer 82 can be formed over each field effect transistor. Each dielectric spacer 82 can be formed by depositing a conformal dielectric material layer and anisotropically etching horizontal portions of the conformal dielectric material layer. The remaining vertical portions of the conformal dielectric material layer constitute the dielectric spacers 82. Each dielectric spacer 82 includes a dielectric material such as silicon oxide, silicon nitride, silicon oxynitride, a dielectric metal oxide, or a combination thereof. The thickness of the conformal dielectric layer is selected to be less than one half of the lateral distance between the source region (62A, 64A) and the drain region (62B, 64B).

Each dielectric spacer 82 is formed on sidewalls of the source region (62A, 64A) and the drain region (62B, 64b) of a field effect transistor. Further, each dielectric spacer 82 contacts a horizontal surface of the buried insulator portion 20, which is a remaining portion of the buried insulator layer 20L. Further, each dielectric spacer 82 overlies (in the upside down position illustrated in FIG. 9) a gate spacer 56, or underlies (if the first semiconductor structure of FIG. 8 is flipped upside down) the gate spacer 82. In the upside-down position illustrated in FIG. 8, each gate spacer 56 laterally surrounds a gate electrode 54, and has a horizontal cross-sectional area that monotonically increases with increasing height (i.e., along the direction from a gate cap dielectric 56 to an overlying buried insulator portion 20).

Each dielectric spacer 82 overlies or underlies peripheral portions of the source region (62A, 64A) and the drain region (62B, 64B). In one embodiment, each dielectric spacer 82 can be formed with three holes as illustrated in FIG. 8A so that one hole overlies (or underlies) a center portion of a gate electrode 54, a second hole overlies (or underlies) a center portion of a source region (62A, 64A), and a third hole overlies (or underlies) a center portion of a drain region (62B, 64B). In this case, the dielectric spacer 82 can be homeomorphic to a three-holed torus, i.e., can be contiguously deformed into a three-holed torus without forming or destroying a singularity (at which multiple points in one object is mapped into a single point in another object).

Figure 9:
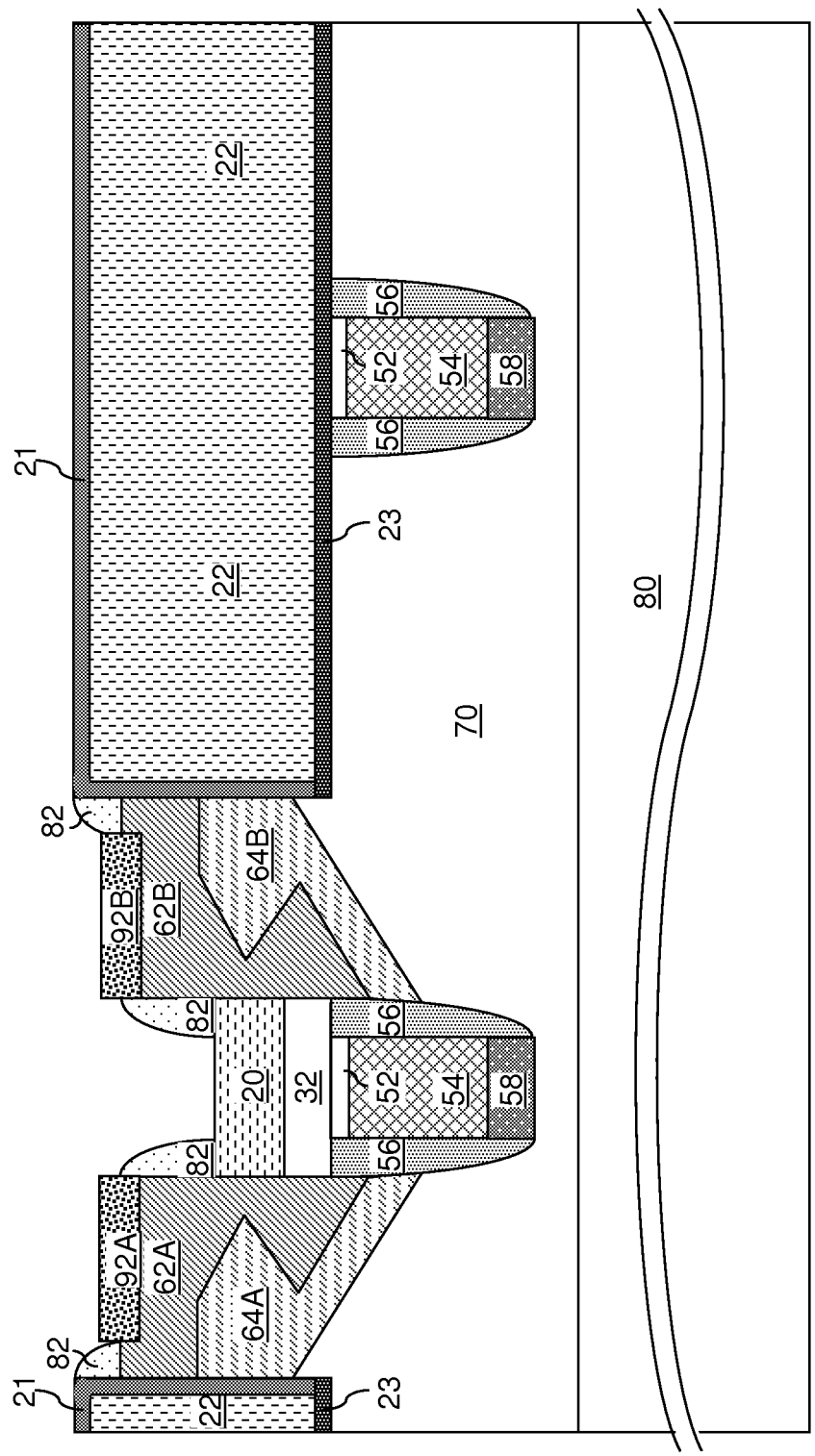
FIG. 9 is a vertical cross-sectional view of the first exemplary semiconductor structure after formation of metal semiconductor alloy portions according to an embodiment of the present disclosure.

Referring to FIG. 9, metal semiconductor alloy portions can be optionally formed, for example, by depositing a metal layer on the semiconductor surfaces of the source region (62A, 64A) and the drain region (62B, 64B), performing an anneal at an elevated temperature, and removing unreacted portions of the metal layer. A source metal semiconductor alloy portion 92A is formed directly on the uppermost surface of the source region (62A, 64A) (in the upside down position illustrated in FIG. 9), and a drain metal semiconductor alloy portion 92B is formed directly on the uppermost surface of the drain region (62B, 64B). If the second semiconductor material of the proximal source portion 62A and the proximal drain portion 62B include silicon, the source metal semiconductor alloy portion 92A and the drain metal semiconductor alloy portion 92B can include a metal silicide.

Figure 10:
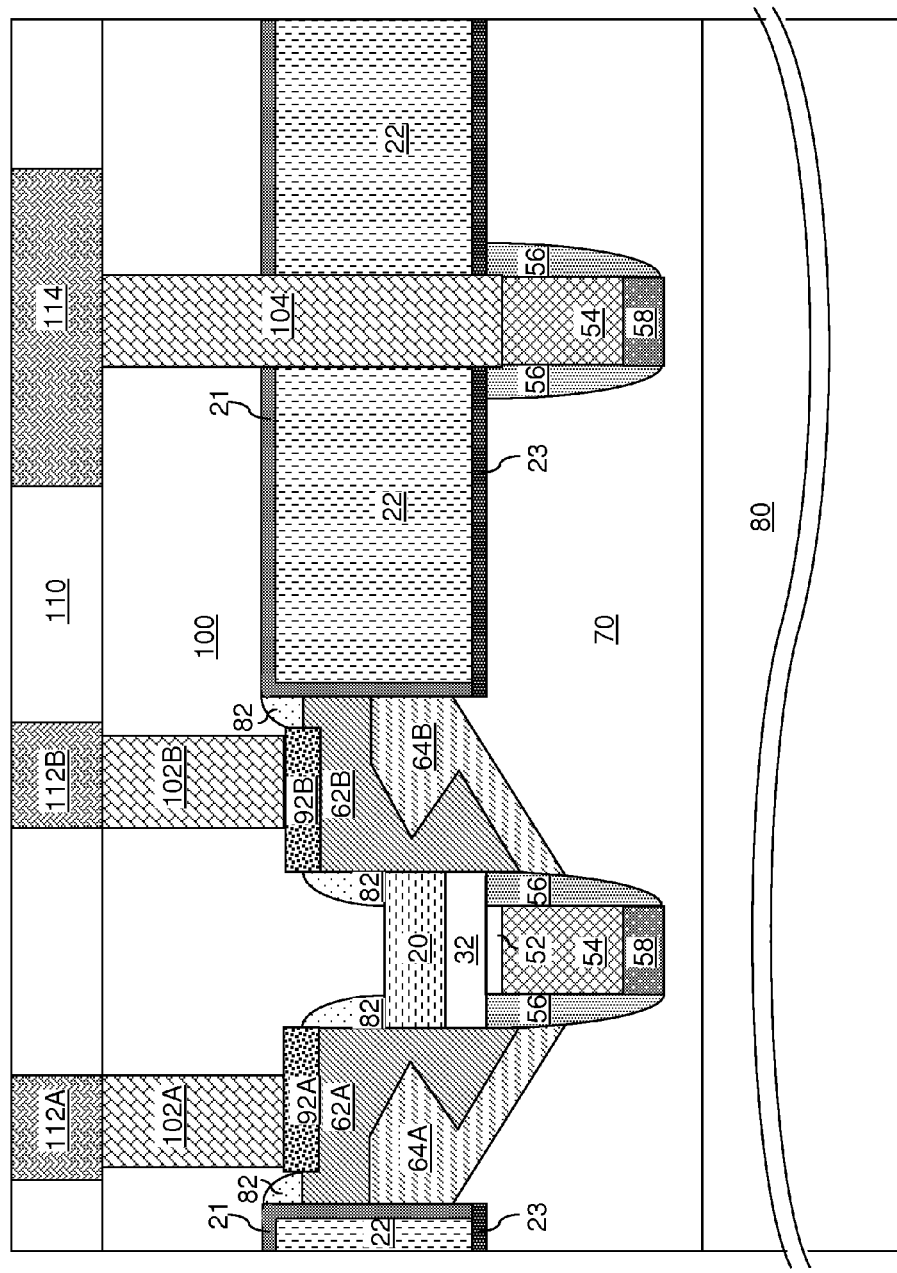
FIG. 10 is a vertical cross-sectional view of the first exemplary semiconductor structure after formation of a contact level dielectric layer, contact via structures, a line level dielectric layer, and metal interconnect line structures according to an embodiment of the present disclosure.

Referring to FIG. 10, a contact level dielectric layer 100 can be formed on the opposite of the planarization dielectric layer 70 with respect to the field effect transistor(s) and the shallow trench isolation structure 22. Thus, the contact level dielectric layer 100 can be formed on the opposite side of the handle substrate 80. The contact level dielectric layer 100 can include a dielectric material such as silicon oxide, silicon nitride, porous or non-porous organosilicate glass (OSG), or a combination thereof. The contact level dielectric layer 100 can be deposited, for example, by chemical vapor deposition (CVD), spin coating, atomic layer deposition (ALD), or combinations thereof. The contact level dielectric layer 100 can be self-planarizing or can be planarized after deposition. The contact level dielectric layer 100 overlies the field effect transistor(s) (in the orientation of the first exemplary semiconductor structure illustrated in FIG. 10). The thickness of the contact level dielectric layer 100 after planarization, as measured in a planar portion overlying the shallow trench isolation structure 22, can be from 50 nm to 1 micron, although lesser and greater thicknesses can also be employed.

Various contact via structures can be formed in the contact level dielectric layer 100, for example, by forming contact via cavities that extend from the top surface of the contact level dielectric layer 100 (as seen in the orientation illustrated in FIG. 10) to the various elements of the field effect transistor(s). For each field effect transistor, the various contact via structures can include a source contact via structure 102A extending through the contact-level dielectric layer 100 and electrically shorted to the source region (62A, 64A), a drain contact via structure 102B extending through the contact-level dielectric layer 100 and electrically shorted to the drain region (62B, 64B), and a gate contact via structure 104 that extends through the contact level dielectric layer 100 and the shallow trench isolation structure 22 and contacting the gate electrode 54. The gate contact via structure 104 contacts the gate electrode 54 and vertically extends at least between, and beyond, a first horizontal plane of a topmost surface of the stack of the buried insulator portion 20 and the body-containing region 32 and the gate dielectric 52 and a second horizontal plane of the bottommost surface of the stack (20, 32) and the gate dielectric 52.

For each field effect transistor, the gate electrode 54 is vertically spaced from the contact level dielectric layer 100 by a greater distance than the body-containing region 32 is vertically spaced by the contact level dielectric layer 100. The body-containing region 32 is vertically spaced from the contact level dielectric layer 100 at least by the buried insulator portion 32. The contact level dielectric layer 100 is in contact with the buried insulator portion 20.

A line level dielectric layer 110 can be subsequently formed over the contact level dielectric layer 110, and various metal line structures can be subsequently formed. The various metal line structures can include, for example, a source line structure 112A electrically shorted to the source region (62A, 64A), a drain line structure 112B electrically shorted to the drain region (62B, 64B), and a gate line structure 114 electrically shorted to the gate electrode 54.

Figure 11:
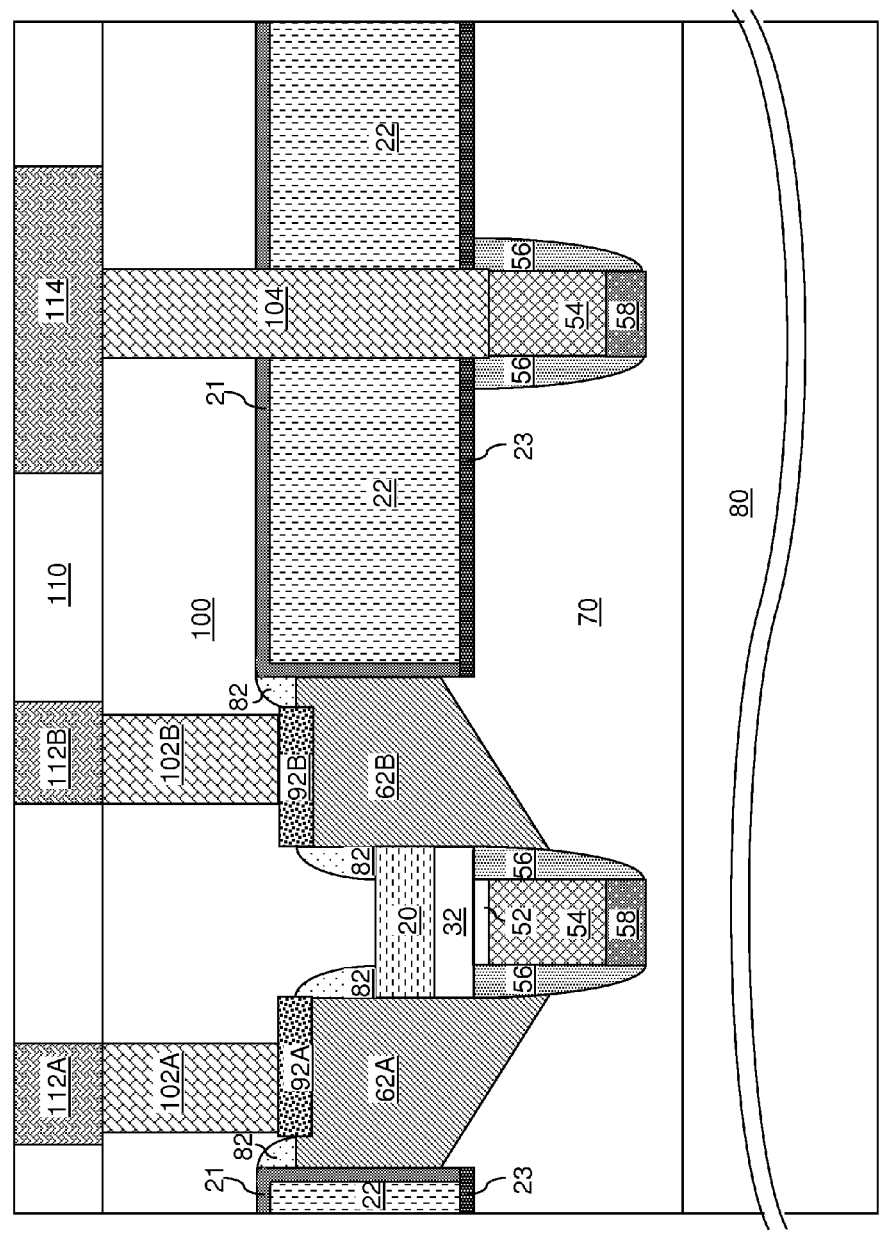
FIG. 11 is a vertical cross-sectional view of a variation of the first exemplary semiconductor structure according to an embodiment of the present disclosure.

Referring to FIG. 11, a variation of the first exemplary semiconductor structure is derived from the first exemplary semiconductor structure by selectively depositing only the second semiconductor material to form the source region and the drain region. In other words, the at least one additional semiconductor material employed to form the distal source portion 64A and the distal drain portion 64B at the processing step of FIG. 4 in the first embodiment is not employed in this variation. In this case, the source region can include only a proximal source portion 62A and the drain region can include only a proximal drain portion 62B. The proximal source portion 62A of this variation can have substantially the same volume as the source region (62A, 64A) of the first exemplary semiconductor structure, and the proximal drain portion 62B of this variation can have substantially the same volume as the drain region (62B, 64B) of the first exemplary semiconductor structure.

Figure 12:
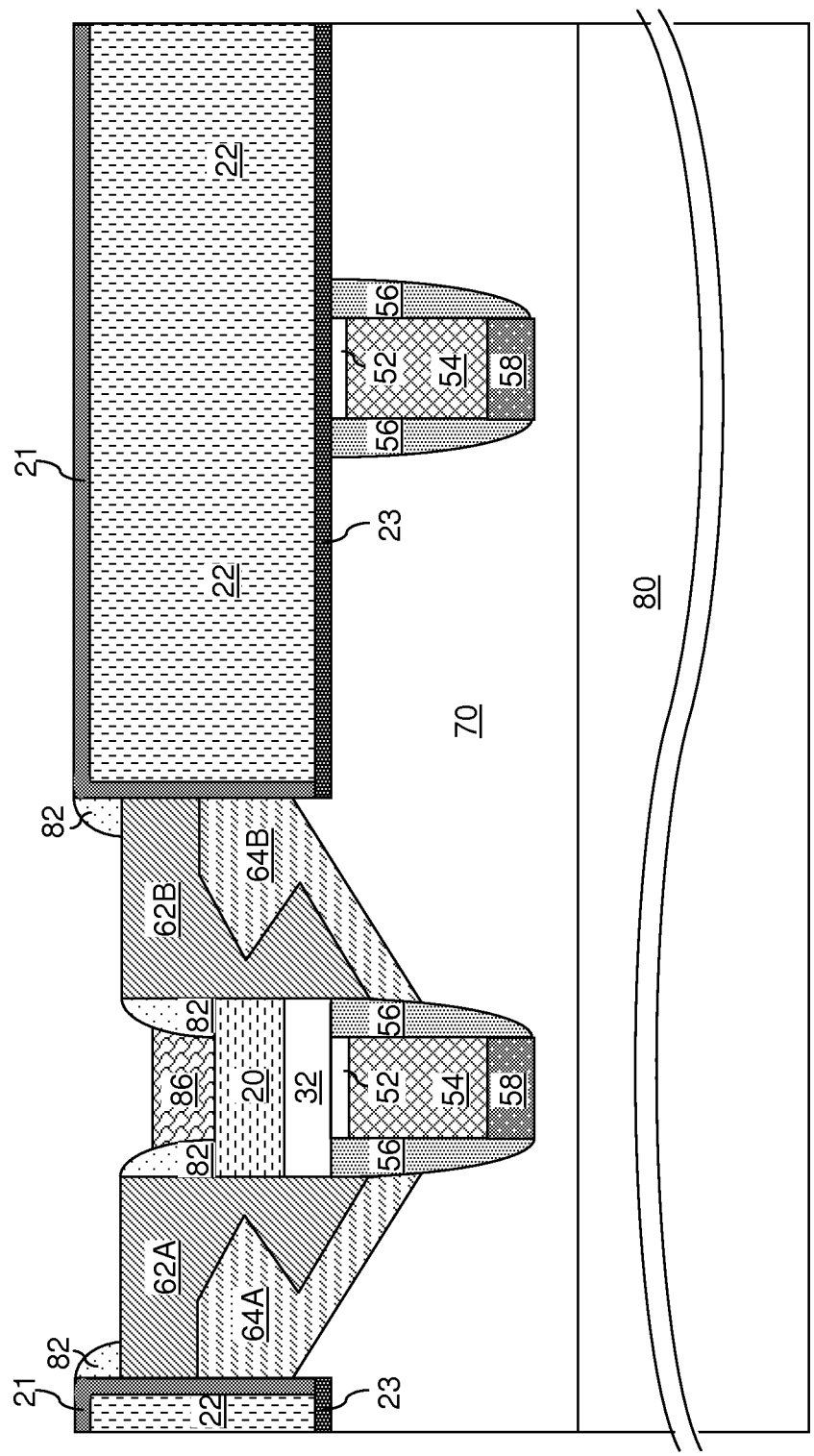
FIG. 12 is a vertical cross-sectional view of a second exemplary semiconductor structure after deposition and planarization of a conductive material layer and selective recessing of the conductive material layer relative to the second semiconductor material to form a back gate electrode according to an embodiment of the present disclosure.

Referring to FIG. 12, a second exemplary semiconductor structure can be derived from the first exemplary semiconductor structure of FIG. 8 by forming a conductive material portion over the buried insulator portion 20. In one embodiment, a conductive material layer including a conductive material that is different from the second semiconductor material is deposited directly on the top surface of the buried insulator portion 20, surfaces of the dielectric spacer 82, a horizontal top surface of the source region (62A, 64A), and a horizontal top surface of the drain region (62B, 64B). In one embodiment, the conductive material layer can be a doped semiconductor layer including a different semiconductor material from the second semiconductor material. In another embodiment, the conductive material layer can be a metallic layer. The conductive material layer can be planarized, for example, employing the shallow trench liner 21 as a stopping layer.

Subsequently, the planarized conductive material layer is vertically recessed so that the conductive material is removed from above the horizontal top surface of the source region (62A, 64A) and the horizontal top surface of the drain region (62B, 64B). After the recessing, a remaining portion of the conductive material layer above the buried insulator portion 20 constitutes a back gate electrode 86, which directly contacts the buried insulator portion 20. After the horizontal top surface of the source region (62A, 64A) and the horizontal top surface of the drain region (62B, 64B) are physically exposed, the recessing of the remaining portion of the conductive material layer can be performed selective to the second semiconductor material to minimize removal of the source region (62A, 64A) and the drain region (62B, 64B). The dielectric spacer 82 is in contact with a sidewall of the source region (62A, 64A), a sidewall of the drain region (62B, 64B), a horizontal surface of the buried insulator portion 20, and the back gate electrode 86.

Figure 13:
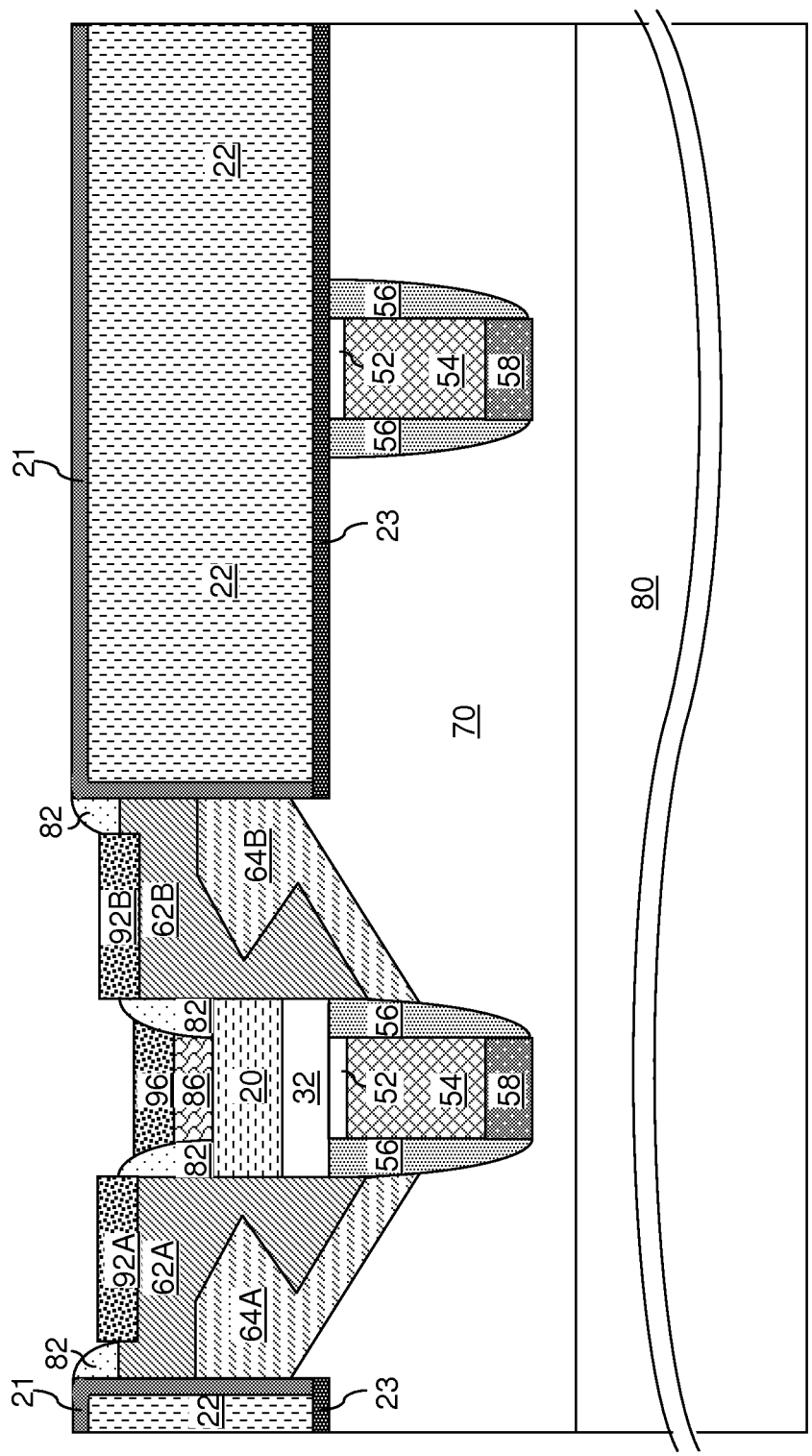
FIG. 13 is a vertical cross-sectional view of the second exemplary semiconductor structure after formation of various metal semiconductor alloy portions according to an embodiment of the present disclosure.

Referring to FIG. 13, metal semiconductor alloy portions can be optionally formed, for example, by depositing a metal layer on the semiconductor surfaces of the source region (62A, 64A), the drain region (62B, 64B), and the back gate electrode 86 (if the back gate electrode 86 includes a semiconductor material), performing an anneal at an elevated temperature, and removing unreacted portions of the metal layer. A source metal semiconductor alloy portion 92A is formed directly on the uppermost surface of the source region (62A, 64A) (in the upside down position illustrated in FIG. 13), and a drain metal semiconductor alloy portion 92B is formed directly on the uppermost surface of the drain region (62B, 64B), and a back gate metal semiconductor alloy portion 96 is formed on the top surface of the back gate electrode 86. If the second semiconductor material of the proximal source portion 62A, the proximal drain portion 62B, and/or the back gate electrode 86 include silicon, the source metal semiconductor alloy portion 92A, the drain metal semiconductor alloy portion 92B, and/or the back gate metal semiconductor alloy portion 96 can include a metal silicide.

Figure 14:
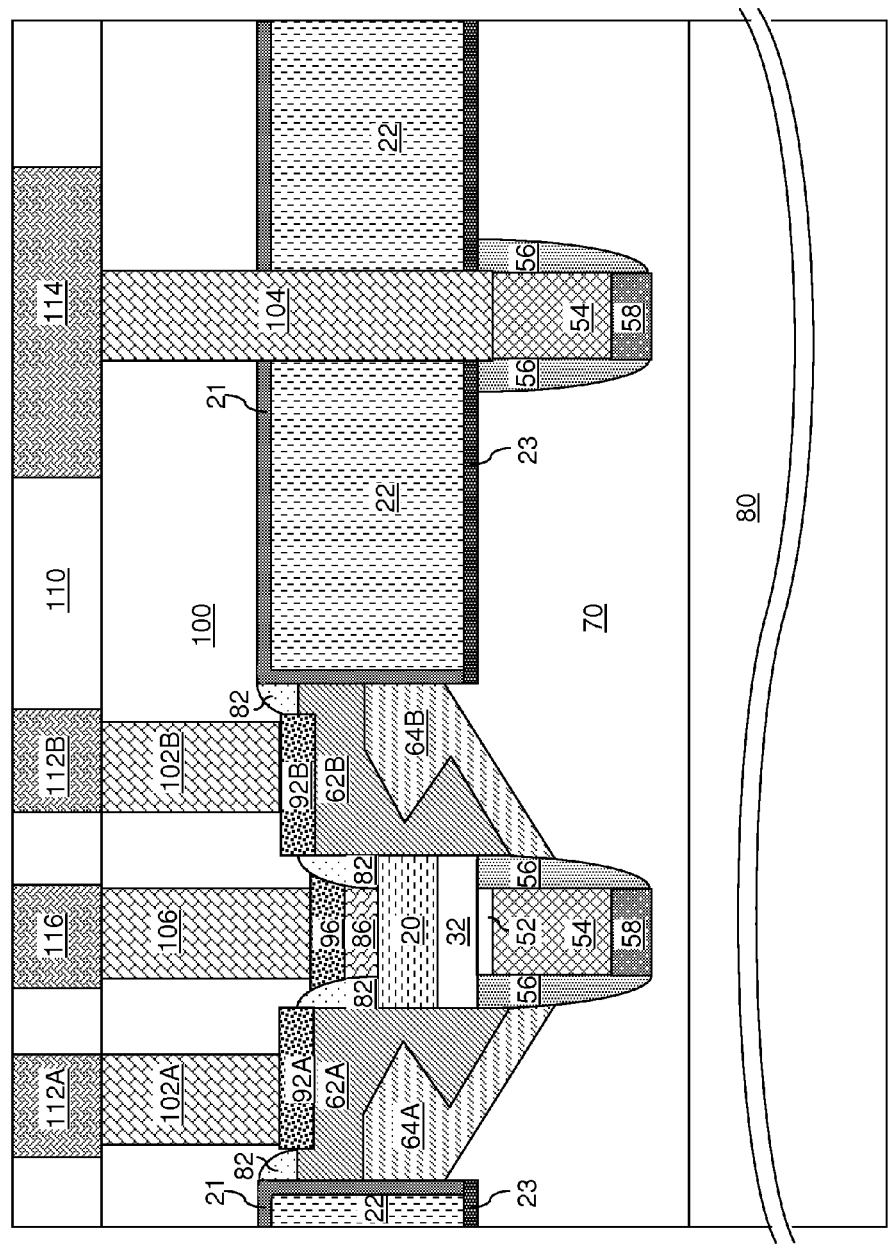
FIG. 14 is a vertical cross-sectional view of the second exemplary semiconductor structure after formation of a contact level dielectric layer, contact via structures, a line level dielectric layer, and metal interconnect line structures according to an embodiment of the present disclosure.

Referring to FIG. 14, a contact level dielectric layer 100 can be formed on the opposite of the planarization dielectric layer 70 with respect to the field effect transistor(s) and the shallow trench isolation structure 22 in the same manner as in the first embodiment. Various contact via structures can be formed in the contact level dielectric layer 100 in the same manner as in the first embodiment. Further, a back gate contact via structure 106 can be formed, which is electrically shorted to the back gate electrode 86 through the back gate metal semiconductor alloy portion 96 or by direct contact to the back gate electrode 86 (if the back gate metal semiconductor alloy portion 96 is not present). The back gate contact via structure 106 is vertically spaced from the buried insulator portion 20 at least by the back gate electrode 86.

For each field effect transistor, the gate electrode 54 and a back gate electrode 86 are provided so that the current flow through the body-containing region 32 can be controlled by two independent bias voltages. The body-containing region 32 is vertically spaced from the contact level dielectric layer 100 at least by the buried insulator portion 32. The contact level dielectric layer 100 is not in contact with the buried insulator portion 20.

A line level dielectric layer 110 and various metal line structures can be subsequently formed. The various metal line structure can include, for example, a source line structure 112A electrically shorted to the source region (62A, 64A), a drain line structure 112B electrically shorted to the drain region (62B, 64B), a gate line structure 114 electrically shorted to the gate electrode 54, and a back gate line structure 116 electrically shorted to the back gate electrode 86.

Figure 15:
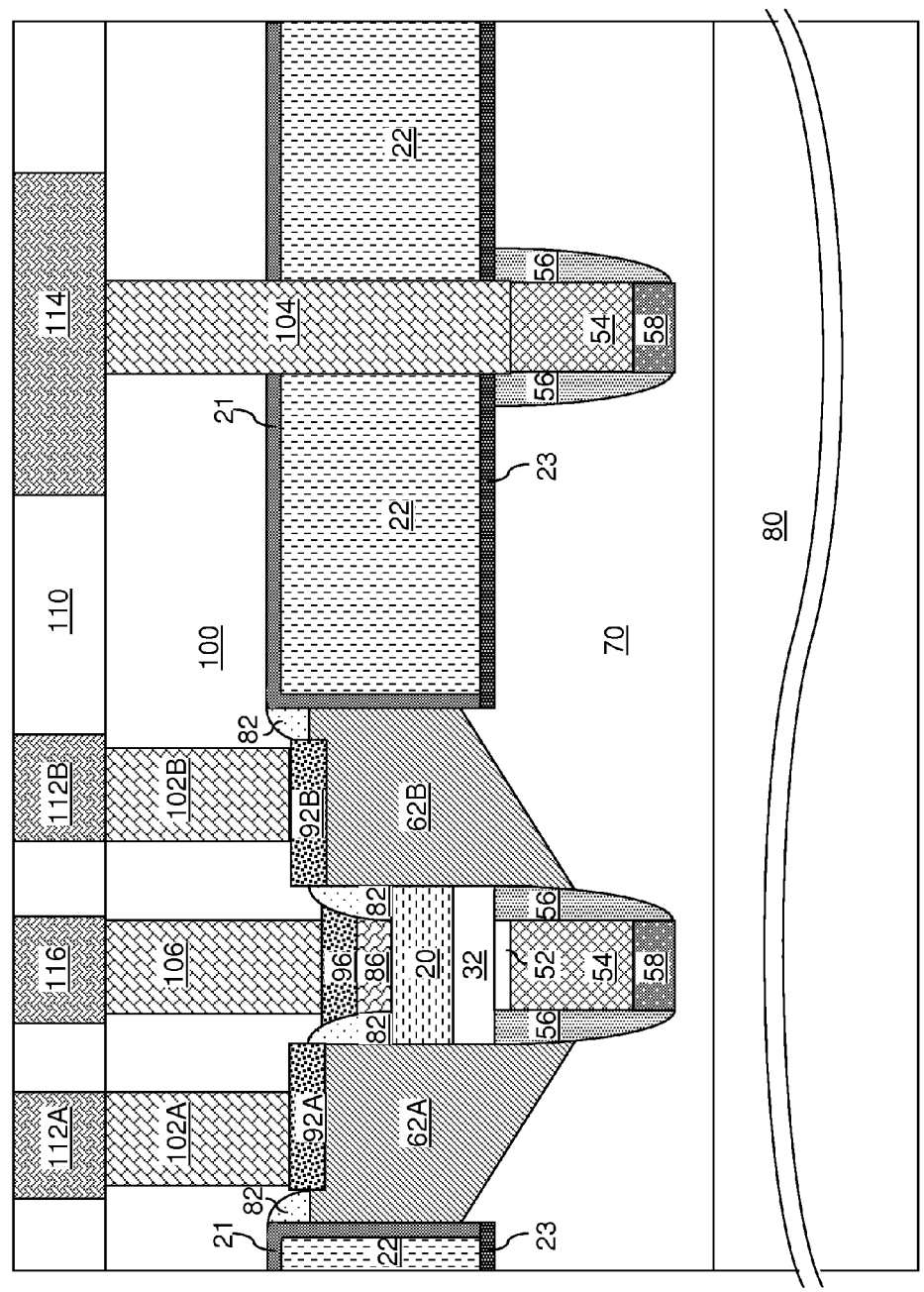
FIG. 15 is a vertical cross-sectional view of a first variation of the second exemplary semiconductor structure according to an embodiment of the present disclosure.

Referring to FIG. 15, a first variation of the second exemplary semiconductor structure is derived from the second exemplary semiconductor structure by selectively depositing only the second semiconductor material to form the source region and the drain region. In this case, the source region can include only a proximal source portion 62A and the drain region can include only a proximal drain portion 62B. The proximal source portion 62A of the first variation of the second exemplary semiconductor structure can have substantially the same volume as the source region (62A, 64A) of the second exemplary semiconductor structure, and the proximal drain portion 62B of the first variation of the second exemplary semiconductor structure can have substantially the same volume as the drain region (62B, 64B) of the second exemplary semiconductor structure.

Figure 16:
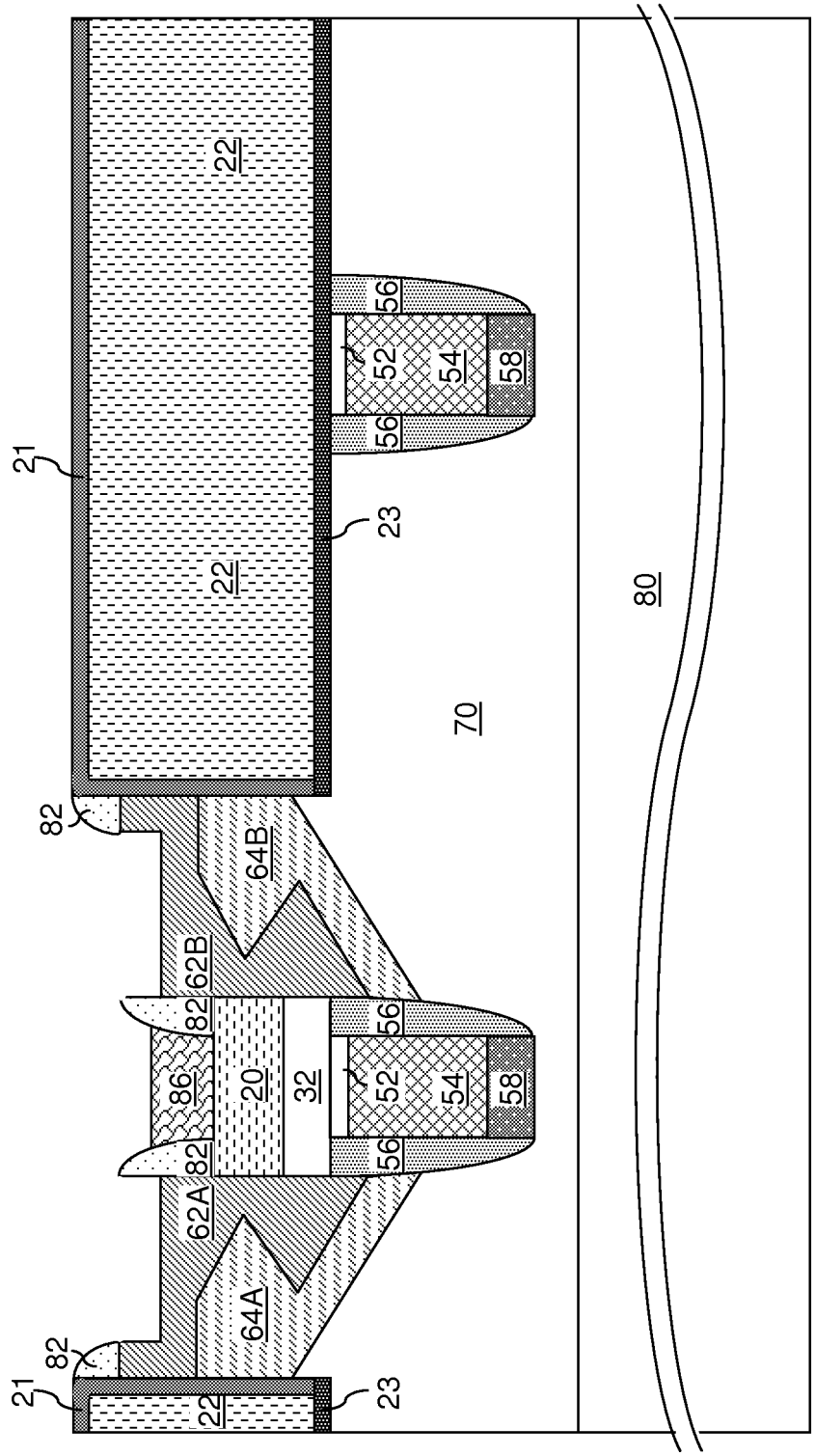
FIG. 16 is a vertical cross-sectional view of a second variation of the second exemplary semiconductor structure after non-selective recessing of the conductive material layer relative to the second semiconductor material to form a back gate electrode according to an embodiment of the present disclosure.

Referring to FIG. 16, a second variation of the second exemplary semiconductor structure can be derived from the second exemplary semiconductor structure by non-selectively recessing the conductive material layer and the source region (62A, 64A) and the drain region (62B, 64B) at the processing step corresponding to FIG. 12. In this case, the conductive material layer can have the same material as, or a different material from, the second semiconductor material of the proximal source portion 62A and the proximal drain portion 62B.

Figure 17:
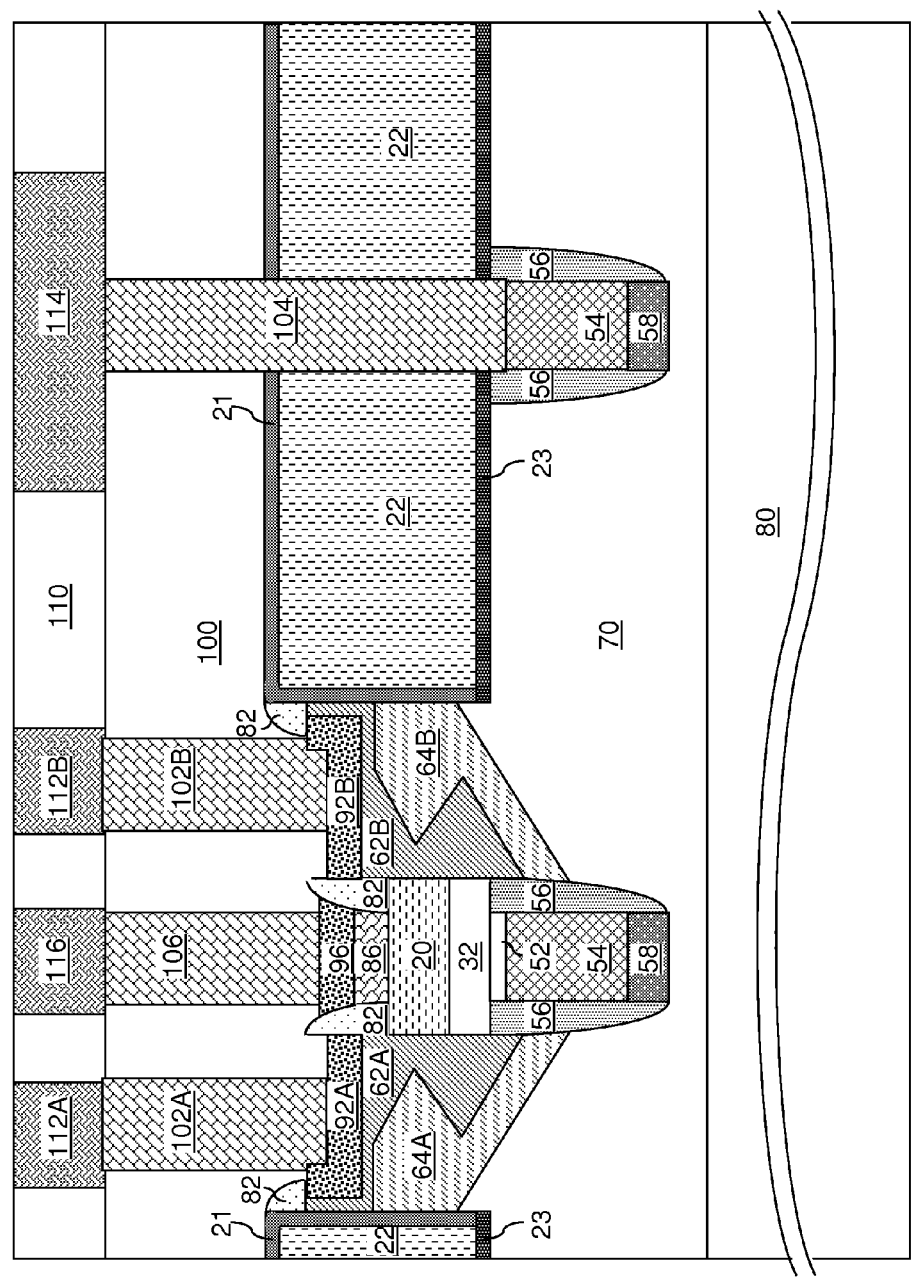
FIG. 17 is a vertical cross-sectional view of the second variation of the second exemplary semiconductor structure after formation of a contact level dielectric layer, contact via structures, a line level dielectric layer, and metal interconnect line structures according to an embodiment of the present disclosure.

Referring to FIG. 17, the processing steps of FIGS. 13 and 14 can be performed to form various metal semiconductor alloy portions (92A, 92B, 98), a contact level dielectric layer 100, contact via structures (102A, 102B, 104, 106), a line level dielectric layer 110, and metal interconnect line structures (112A, 112B, 114, 116) according to an embodiment of the present disclosure.

Figure 18:
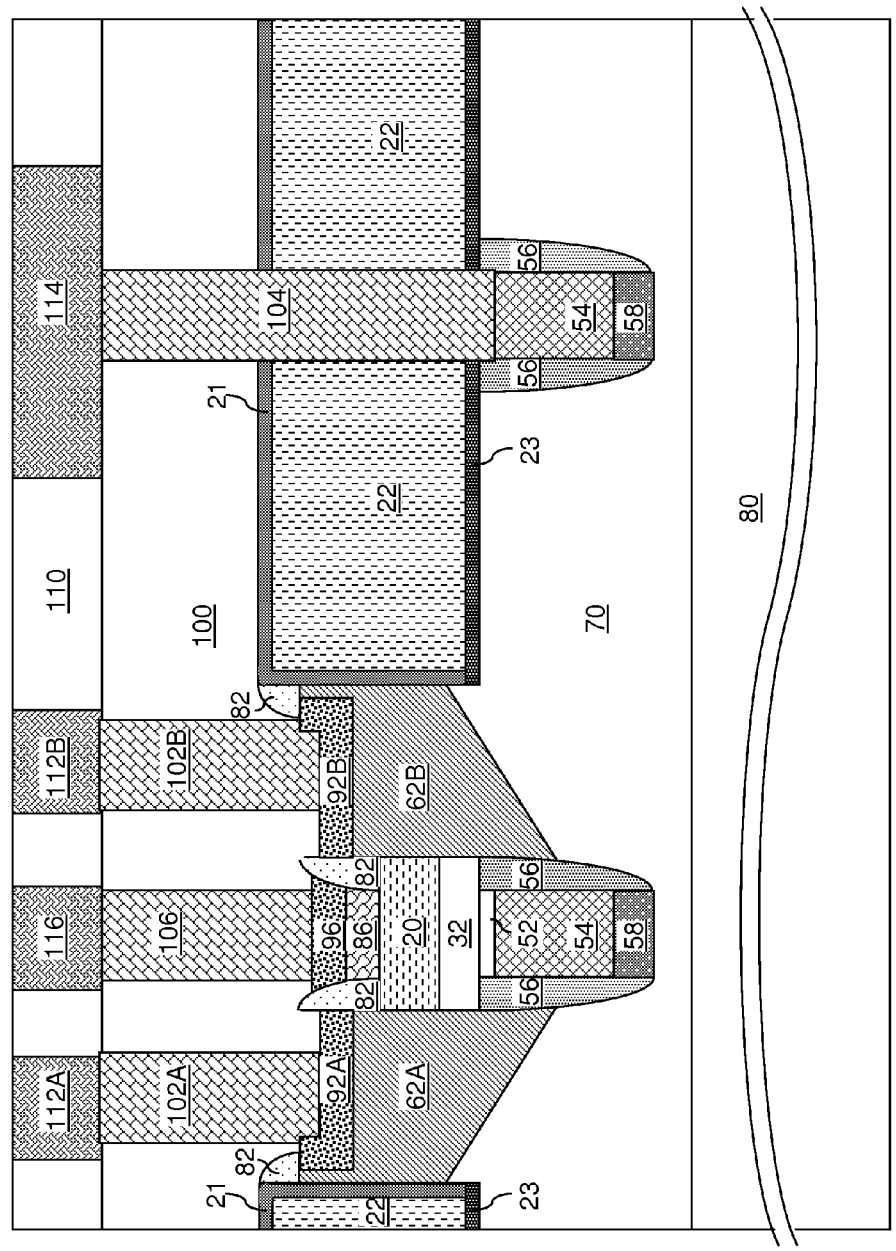
FIG. 18 is a vertical cross-sectional view of a third variation of the second exemplary semiconductor structure after formation of a contact level dielectric layer, contact via structures, a line level dielectric layer, and metal interconnect line structures according to an embodiment of the present disclosure.

Referring to FIG. 18, a third variation of the second exemplary semiconductor structure is derived from the second variation of the second exemplary semiconductor structure by selectively depositing only the second semiconductor material to form the source region and the drain region. In this case, the source region can include only a proximal source portion 62A and the drain region can include only a proximal drain portion 62B. The proximal source portion 62A of the third variation of the second exemplary semiconductor structure can have substantially the same volume as the source region (62A, 64A) of the second variation of the second exemplary semiconductor structure, and the proximal drain portion 62B of the third variation of the second exemplary semiconductor structure can have substantially the same volume as the drain region (62B, 64B) of the second variation of the second exemplary semiconductor structure.

Figure 19:
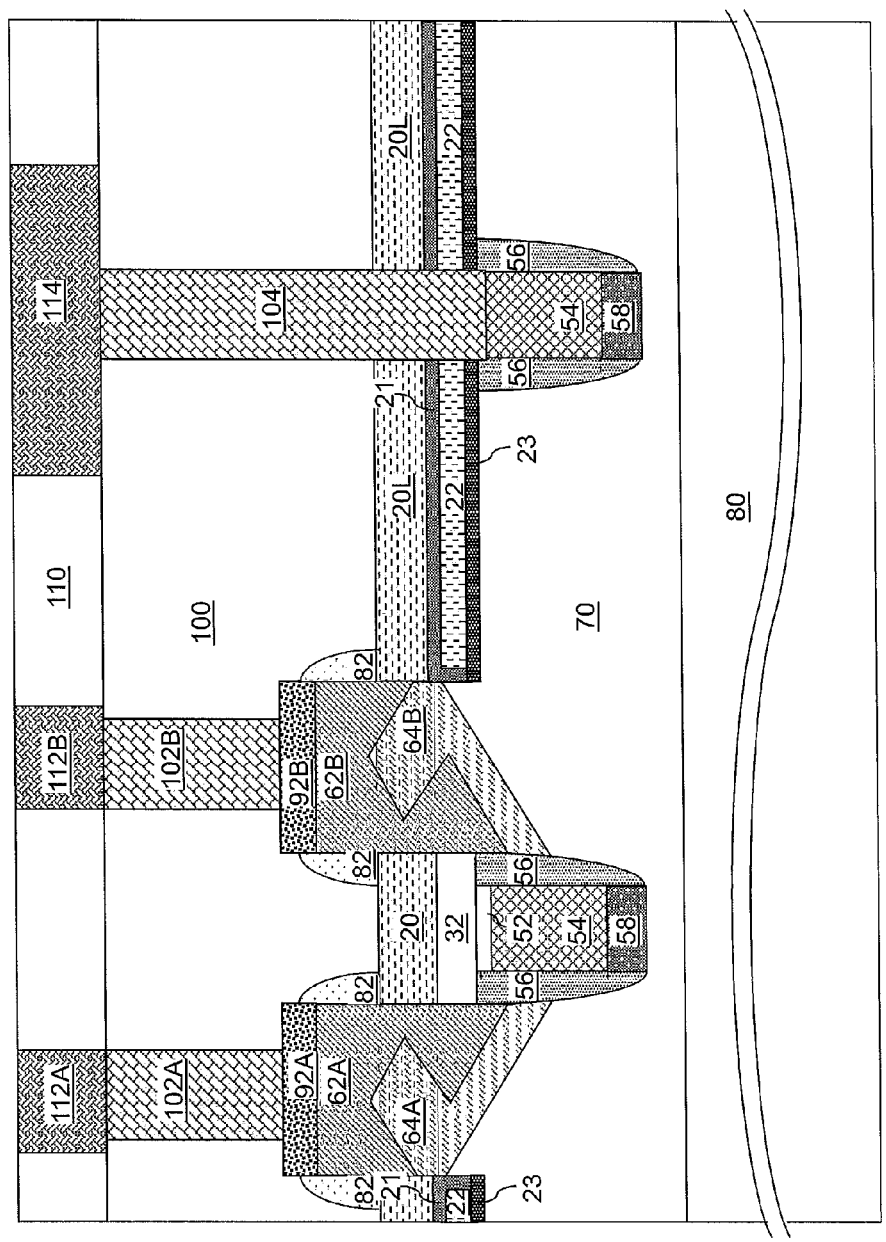
FIG. 19 is a vertical cross-sectional view of a third exemplary semiconductor structure according to an embodiment of the present disclosure.
Figure 19A:
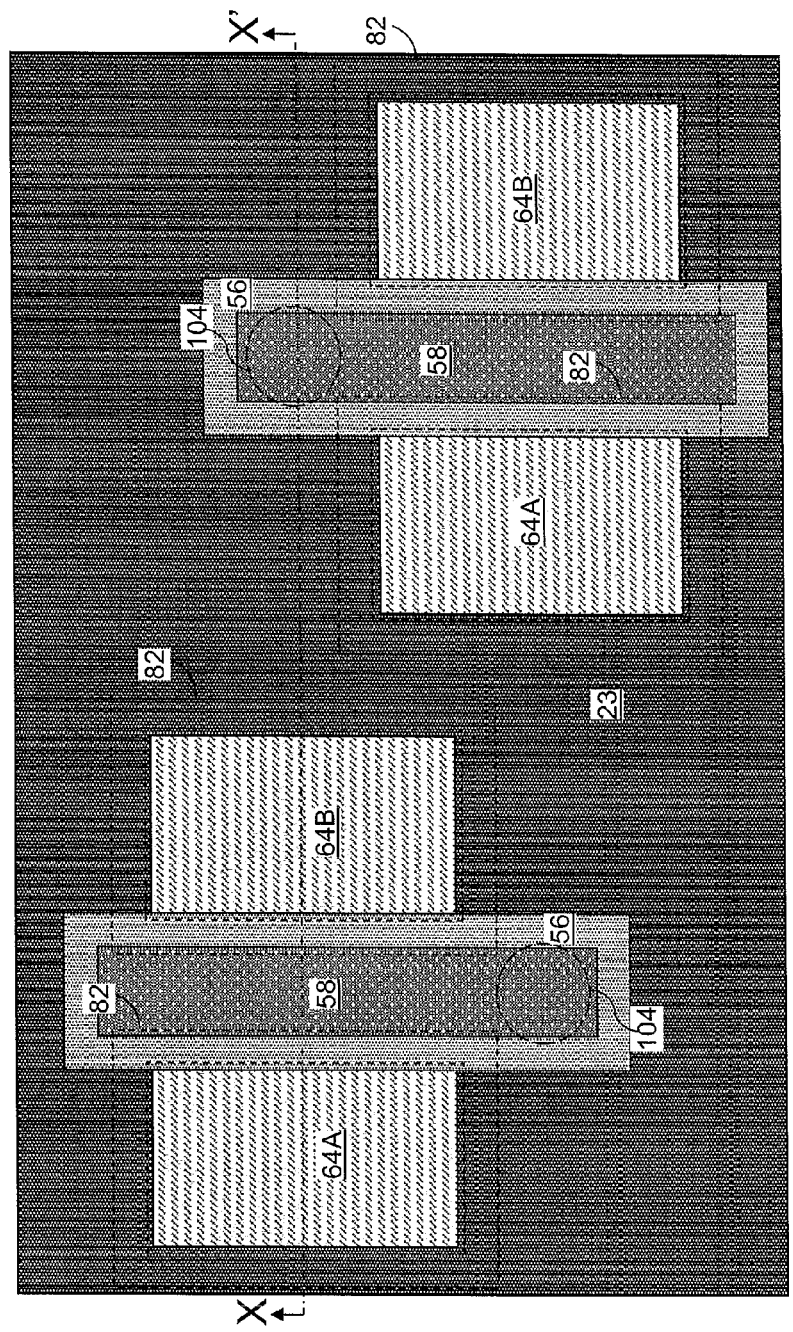
FIG. 19A is a bottom-up view of the third exemplary semiconductor structure of FIG. 19 in which the handle substrate and the planarized dielectric layer are removed for clarity, and the area of the dielectric spacer is schematically marked according to an embodiment of the present disclosure. The plane X-X' is the plane of the vertical cross-section of FIG. 19.

In some embodiments, the shallow trenches in which the shallow trench liner 21 and the shallow trench isolation structure 22 are formed need not extend through the buried insulator layer 20L. Referring to FIGS. 19 and 19A, a third exemplary semiconductor structure can be derived from the first exemplary semiconductor structure by forming a shallow trench liner 21 and a shallow trench isolation structure 22 above the buried insulator layer 20L (when viewed in an orientation in which the top semiconductor layer 30L is above the bottom semiconductor layer 10). The locations of the gate contact via structures 104 are schematically illustrated in FIG. 19A.

Figure 20:
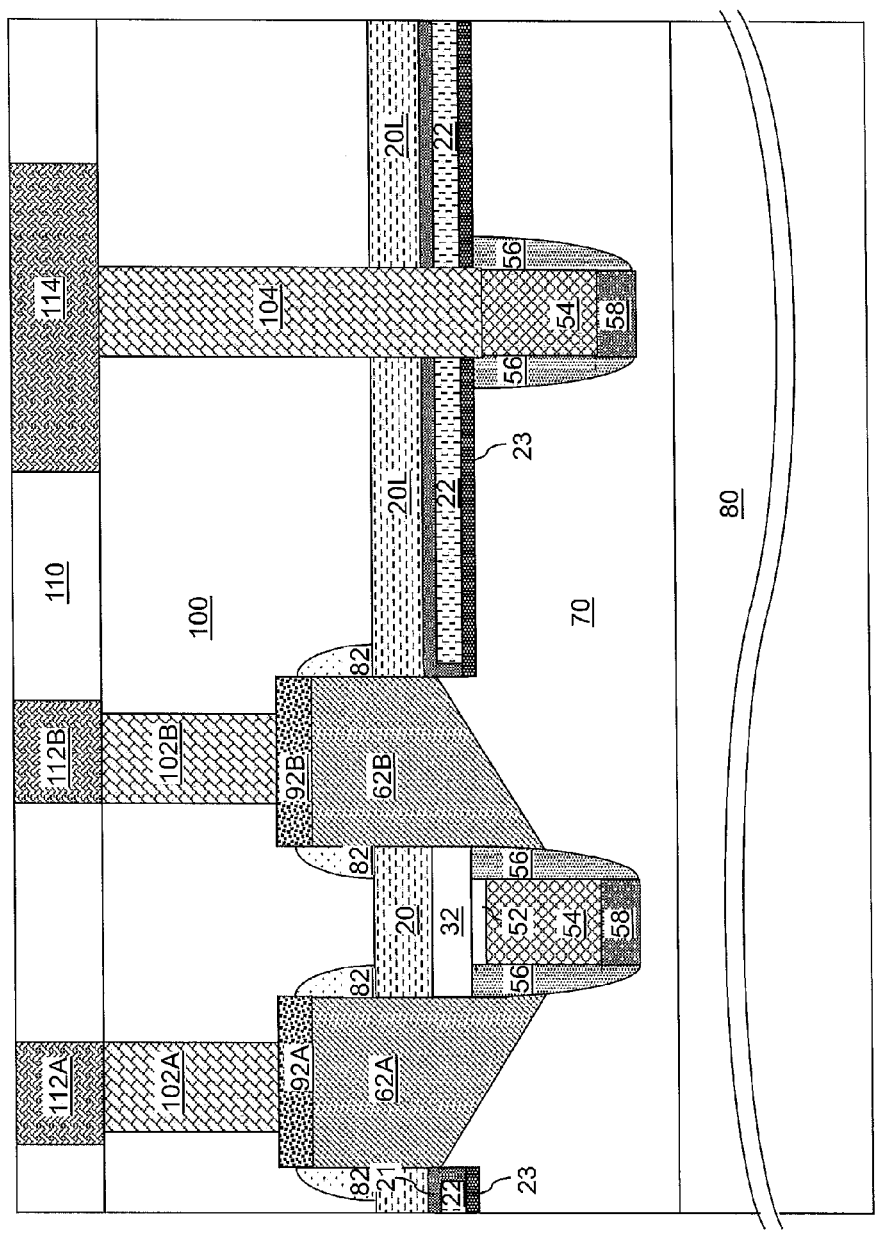
FIG. 20 is a vertical cross-sectional view of a variation of the third exemplary semiconductor structure according to an embodiment of the present disclosure.

Referring to FIG. 20, a variation of the third exemplary semiconductor structure is derived from the third exemplary semiconductor structure by selectively depositing only the second semiconductor material to form the source region and the drain region. In this case, the source region can include only a proximal source portion 62A and the drain region can include only a proximal drain portion 62B. The proximal source portion 62A of the variation of the third exemplary semiconductor structure can have substantially the same volume as the source region (62A, 64A) of the third exemplary semiconductor structure, and the proximal drain portion 62B of the variation of the third exemplary semiconductor structure can have substantially the same volume as the drain region (62B, 64B) of the third exemplary semiconductor structure.

Figure 21:
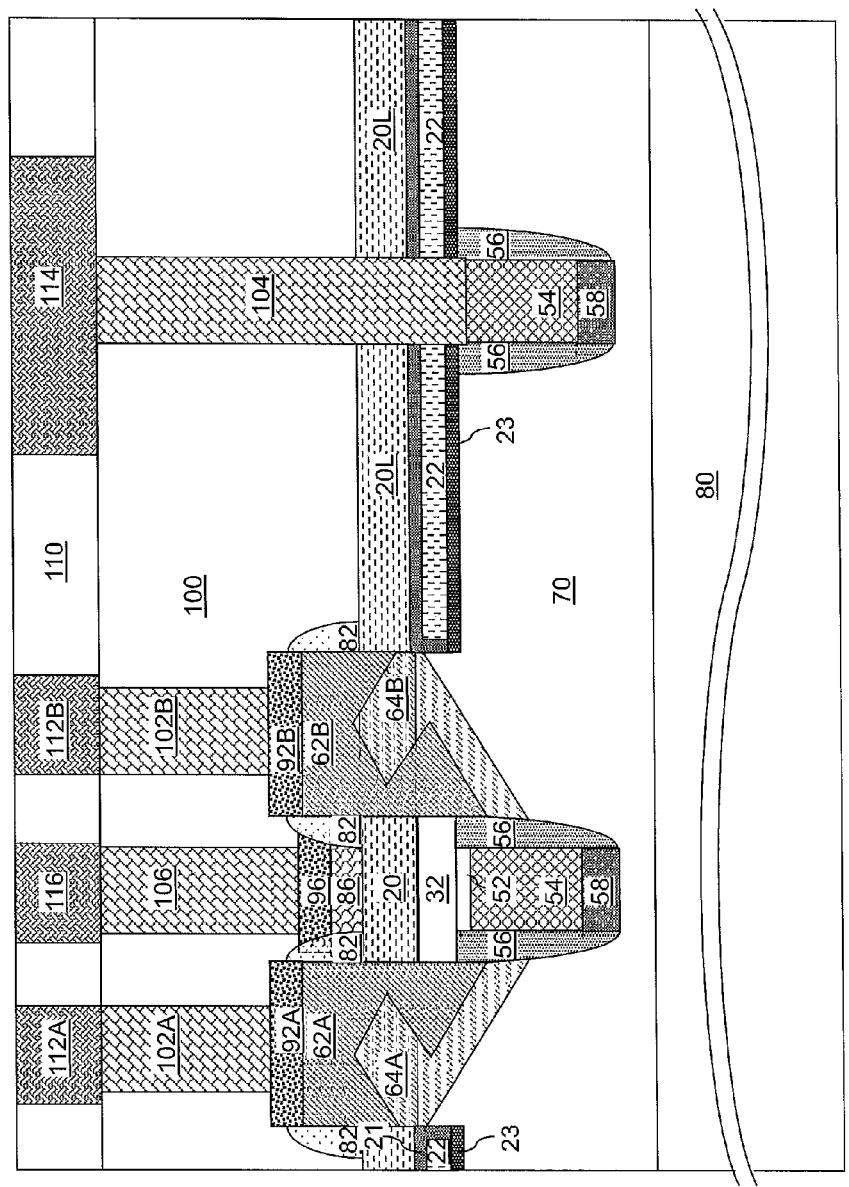
FIG. 21 is a vertical cross-sectional view of a fourth exemplary semiconductor structure according to an embodiment of the present disclosure.

Referring to FIG. 21, a fourth exemplary semiconductor structure can be derived from the second exemplary semiconductor structure by forming a shallow trench liner 21 and a shallow trench isolation structure 22 above the buried insulator layer 20L (when viewed in an orientation in which the top semiconductor layer 30L is above the bottom semiconductor layer 10).

Figure 22:
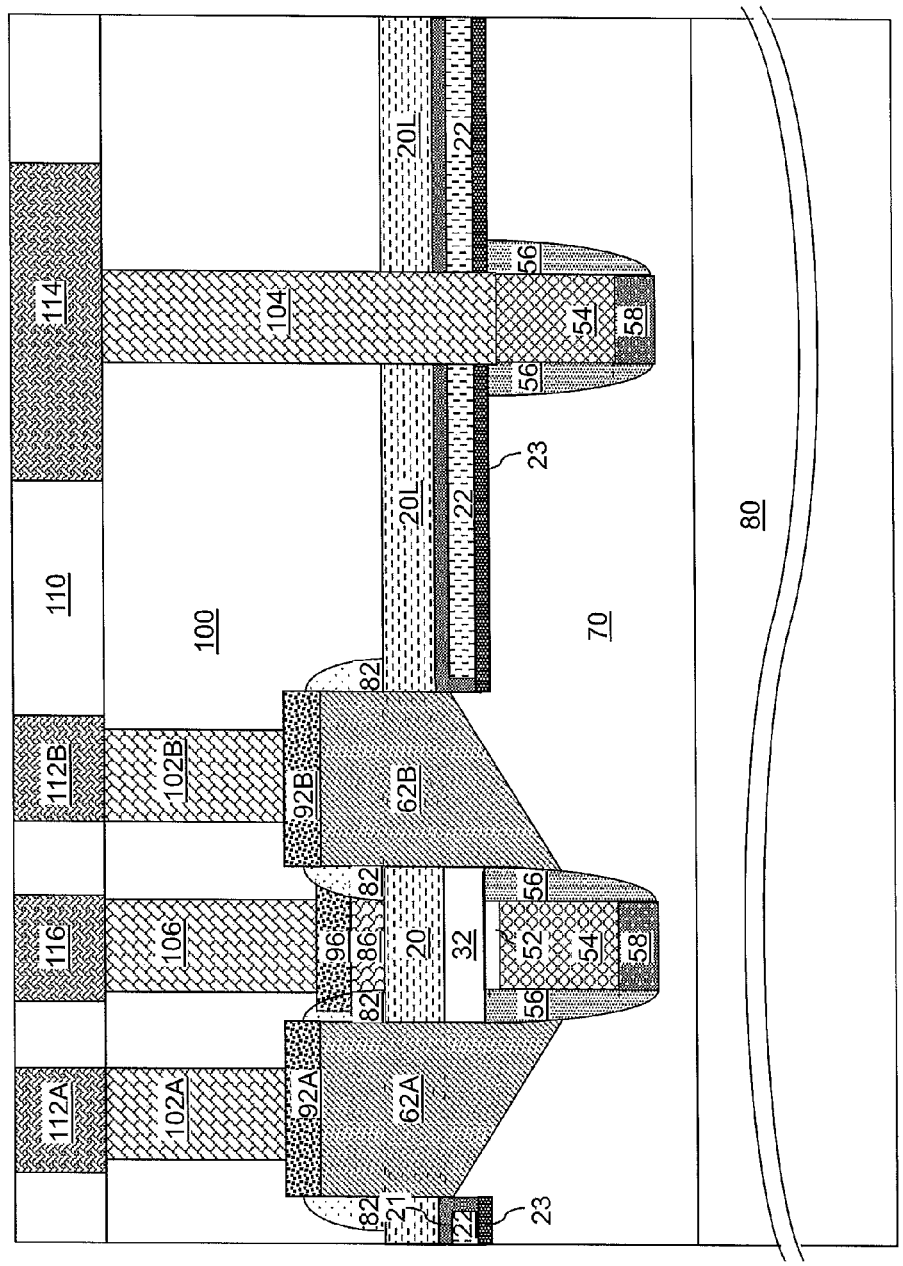
FIG. 22 is a vertical cross-sectional view of a variation of the fourth exemplary semiconductor structure according to an embodiment of the present disclosure.

Referring to FIG. 22, a variation of the fourth exemplary semiconductor structure is derived from the fourth exemplary semiconductor structure by selectively depositing only the second semiconductor material to form the source region and the drain region. In this case, the source region can include only a proximal source portion 62A and the drain region can include only a proximal drain portion 62B. The proximal source portion 62A of the variation of the fourth exemplary semiconductor structure can have substantially the same volume as the source region (62A, 64A) of the fourth exemplary semiconductor structure, and the proximal drain portion 62B of the variation of the fourth exemplary semiconductor structure can have substantially the same volume as the drain region (62B, 64B) of the fourth exemplary semiconductor structure.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A method of manufacturing a semiconductor structure comprising:

forming a gate stack comprising a gate dielectric, a gate electrode, and a gate cap dielectric on a top semiconductor layer of a semiconductor-on-insulator (SOI) substrate, said SOI substrate further comprising a bottom semiconductor layer having a first semiconductor material and a buried insulator layer;

forming a source trench and a drain trench through said top semiconductor layer, said buried insulator layer, and a portion of said bottom semiconductor layer, said source trench and said drain trench abutting said gate stack;

forming a source region and a drain region by depositing at least a second semiconductor material that is different from said first semiconductor material in said source trench and said drain trench, wherein said source region has a surface in contact with a portion of said bottom semiconductor layer in said source trench, and wherein said drain region has a surface in contact with another portion of said bottom semiconductor layer in said drain trench;

removing said bottom semiconductor layer selective to each of said second semiconductor material and said buried insulator layer to expose said surface of said source region, said surface of said drain region, and a horizontal surface of a remaining portion of said buried insulator layer;

forming a dielectric spacer on each of sidewalls of said source region and said drain region, wherein said dielectric spacer contacts said horizontal surface of said remaining portion of said buried insulator layer;

depositing a conductive material layer directly on said horizontal surface of said remaining portion of said buried insulator layer, a surface of each dielectric spacer, said surface of said source region, and said surface of said drain region;

planarizing said conductive material layer to expose said surface of said source region and said surface of said drain region; and vertically recessing said planarized conductive material layer such that a topmost surface of a remaining portion of said conductive material layer is below said surface of said source region and said surface of said drain region, wherein said remaining portion of said conductive material layer constitutes a back gate electrode contacting said horizontal surface of said remaining portion of said buried insulator layer.

2. The method of claim 1, further comprising:

depositing a planarization dielectric layer over said gate stack, said source region, and said drain region;

planarizing said planarization dielectric layer; and bonding a handle substrate to a planarized surface of said planarization dielectric layer.

3. The method of claim 2, wherein said removing of said bottom semiconductor layer comprises:

removing a portion of said bottom semiconductor layer vertically spaced from said source region and said drain region by grinding of said bottom semiconductor layer or by cleaving of said bottom semiconductor layer; and removing a remaining portion of said bottom semiconductor layer by an etch that is selective to each of said second semiconductor material and said buried insulator layer.

4. The method of claim 1, further comprising:

forming a contact level dielectric layer on said dielectric spacer, said surface of said source region, said surface of said drain region, and said back gate electrode;

forming a gate contact via structure that extends through said contact level dielectric layer, a shallow trench isolation structure, and a portion of said gate dielectric;

forming a back gate contact via structure that is electrically shorted to said back gate electrode and vertically spaced from said remaining portion of said buried insulator layer.

5. The method of claim 1, wherein said forming the source region and the drain region comprises selective epitaxy.

6. The method of claim 1, wherein said first semiconductor material is a silicon germanium alloy and said second semiconductor material is silicon or a silicon carbon alloy.

7. The method of claim 1, wherein said first semiconductor material is silicon and said second semiconductor material is a silicon germanium alloy or a silicon carbon alloy.

8. The method of claim 1, further comprising forming a shallow trench isolation structure which extends from said top semiconductor layer of the semiconductor-on-insulator (SOI) substrate to an upper portion of said bottom semiconductor layer, wherein said shallow trench isolation structure is formed prior to forming said gate stack.

9. The method of claim 1, wherein said forming said shallow trench isolation structure comprises forming a shallow trench isolation cap on a surface of a trench dielectric material.

10. The method of claim 9, wherein said shallow trench isolation cap comprises silicon nitride or a dielectric metal oxide.

11. The method of claim 1, further comprising forming gate spacers on sidewalls of said gate stack.

* * * * *